(12) United States Patent
Bottomley et al.

(10) Patent No.: US 9,482,728 B2
(45) Date of Patent: Nov. 1, 2016

(54) METHODS, SYSTEMS AND DEVICES FOR LOCAL MAGNETIC RESONANCE IMAGING

(75) Inventors: Paul A. Bottomley, Columbia, MD (US); Shashank Sathyanarayana, Bangalore (IN)

(73) Assignee: The Johns Hopkins University, Baltimore, MD (US)

(*) Notice: Subject to any disclaimer, the term of this patent is extended or adjusted under 35 U.S.C. 154(b) by 1029 days.

(21) Appl. No.: 12/521,570

(22) PCT Filed: Dec. 31, 2007

(86) PCT No.: PCT/US2007/026499
§ 371 (c)(1),
(2), (4) Date: Jun. 16, 2010

(87) PCT Pub. No.: WO2008/082661
PCT Pub. Date: Jul. 10, 2008

(65) Prior Publication Data
US 2010/0256480 A1    Oct. 7, 2010

Related U.S. Application Data

(60) Provisional application No. 60/877,733, filed on Dec. 29, 2006.

(51) Int. Cl.
*A61B 5/055*     (2006.01)
*G01R 33/28*     (2006.01)
*G01R 33/34*     (2006.01)
*G01R 33/36*     (2006.01)
(Continued)

(52) U.S. Cl.
CPC ....... *G01R 33/285* (2013.01); *G01R 33/34053* (2013.01); *G01R 33/34084* (2013.01); *G01R 33/3685* (2013.01); *G01R 33/421* (2013.01); *G01R 33/422* (2013.01); *G01R 33/4833* (2013.01); *G01R 33/445* (2013.01); *Y10T 29/49016* (2015.01)

(58) Field of Classification Search
None
See application file for complete search history.

(56) References Cited

U.S. PATENT DOCUMENTS 6,031,375 A    2/2000    Atalar et al.
7,835,780 B1 *  11/2010    Duerk ............... G01R 33/287
                                                  600/410

(Continued)

OTHER PUBLICATIONS

Lederman, Robert J. et al., "Getting Closer for High-Resolution Vacular MRI," J. Am. Coll. Cardiol. Img. 2010;3;1166-1167.

(Continued)

*Primary Examiner* — Serkan Akar
(74) *Attorney, Agent, or Firm* — Mintz Levin Cohn Ferris Glovsky and Popeo, P.C.; Peter F. Corless; Richard B. Emmons

(57) ABSTRACT

Featured are a device with localized sensitivity to magnetic resonance signals, an imaging system using such a device and MRI methods for performing internal MRI or MRI Endoscopy. Such an MRI method includes introducing an MRI antenna or probe into the specimen to be imaged, the antenna being configured in accordance with the devices described herein, so that the spatial coordinate frame of imaging is inherently locked or defined with respect to the introduced antenna thereby providing imaging of the specimen from the point of view of the antenna. Further such imaging is conducted so that the MRI signal is confined substantially to a volume with respect to a particular region of the antenna or probe.

24 Claims, 29 Drawing Sheets

RF Transmission by a probe whose sensitivity is constrained to a disk excites a small volume. Reception of signal using the same probe ensures an image arising from this volume.

(51) Int. Cl.
  *G01R 33/421* (2006.01)
  *G01R 33/422* (2006.01)
  *G01R 33/483* (2006.01)
  *G01R 33/44* (2006.01)

(56) References Cited

U.S. PATENT DOCUMENTS

2002/0045816 A1   4/2002   Atalar et al.
2003/0028095 A1   2/2003   Tulley et al.
2006/0241368 A1   10/2006  Fichtinger et al.

OTHER PUBLICATIONS

Kramer, Christopher M. et al., "Whither Catheter-Based Intravacular Magnetic Resonance Imaging of Atherosclerosis?" J. Am. Coll. Cardiol. lmg. 2010;3;1203-1204.

Sathyanarayana, Shashank et al., "Towards Real-Time Intravascular Endoscopic Magnetic Resonance Imaging," J. Am. Coll. Cardiol. lmg. 2010;3;1158-1165.

Aharon Blank, et al. "Miniature self-contained intravascular magnetic resonance (IVMI) probe for clinical applications", Magnetic Resonance in Medicine, vol. 54, No. 1, Jun. 20, 2005, pp. 105-112.

Schneiderman, J., et al., "Diagnosis of Thin-Cap Fibroatheromas by a Self-Contained Intravascular Magnetic Resonance Imaging Probe in Ex Vivo Human Aortas and in Situ Coronary Arteries", Journal of the American College of Cardiology, vol. 45,No. 12, Jun. 21, 2005, pp. 1961-1969.

Hurst, G. C., et al., "Intravascular (Catheter) NMR receiver probe: Preliminary Design Analysis and Application to Canine Iliofemoral Imaging", Magnetic Resonance in Medicine, Academic Press, vol. 24, No. 2, Apr. 1, 1992, pp. 343-357.

Hillebrand, C. M., et al., "Active Device Tracking and High-Resolution Intravascular MRI Using a Novel Catheter-Based, Opposed-Solenoid Phased Array Coil", Magnetic Resonance in Medicine, Academic Press, vol. 51, Mar. 26, 2004, pp. 668-675.

Extended European Search Report from EP application No. 07868141.8, mailed on May 6, 2013.

* cited by examiner

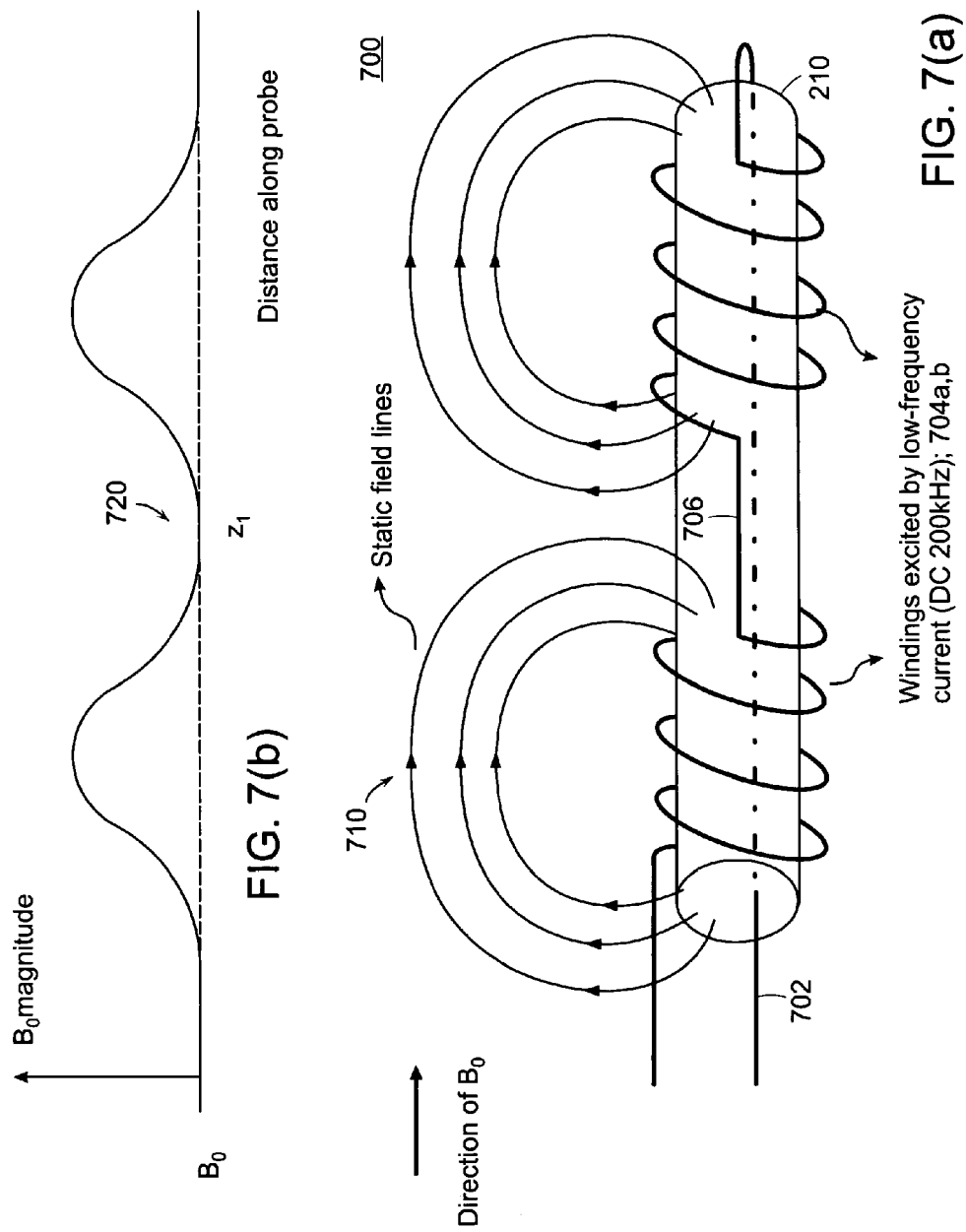

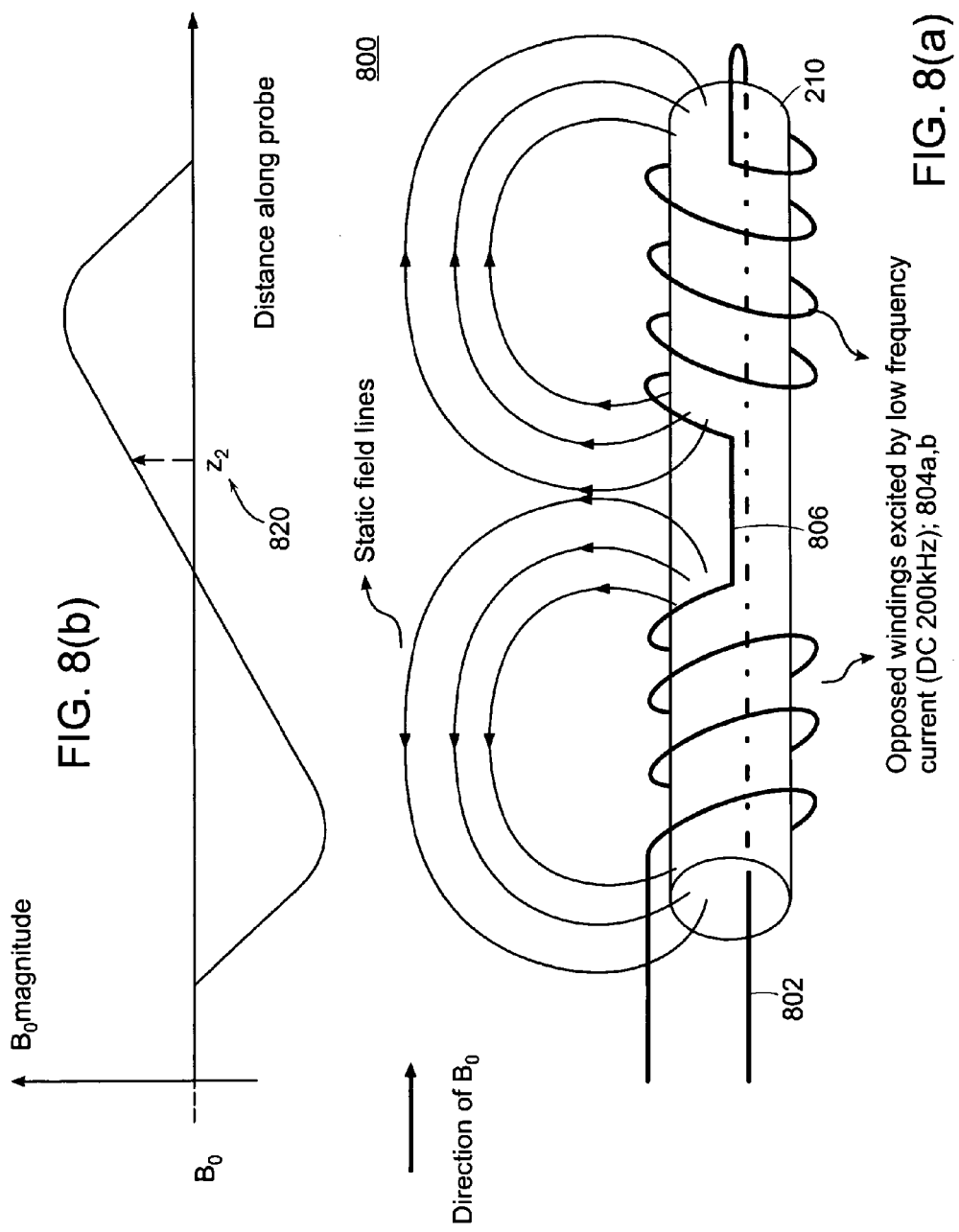

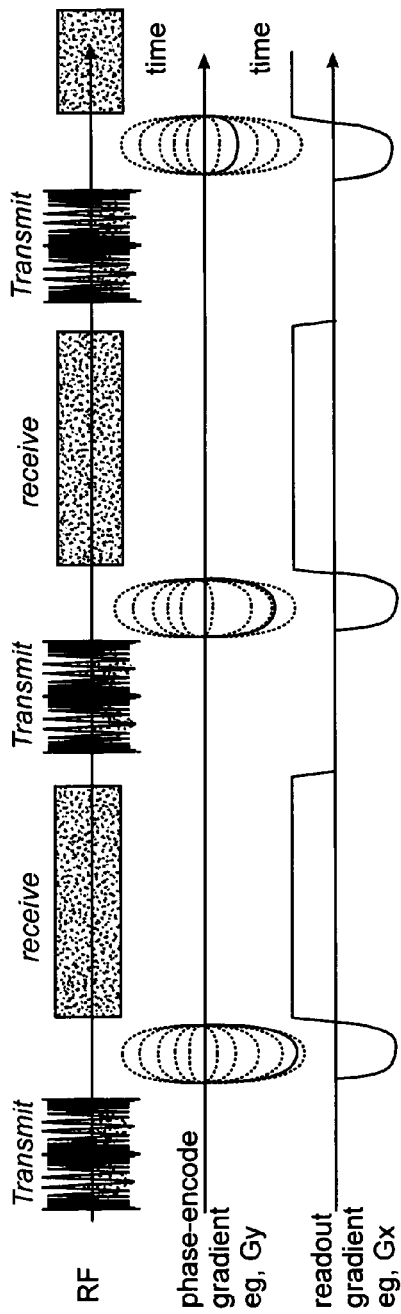
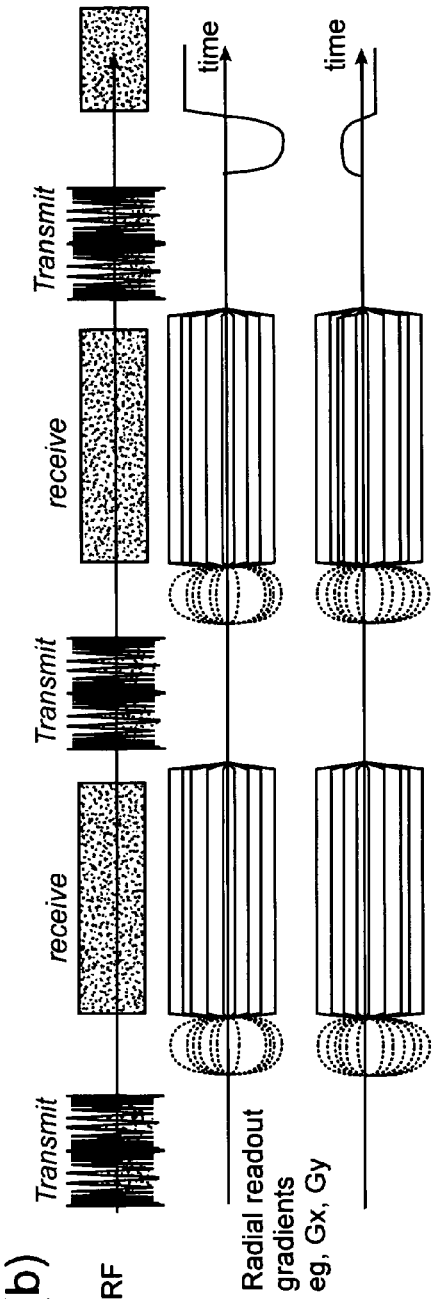

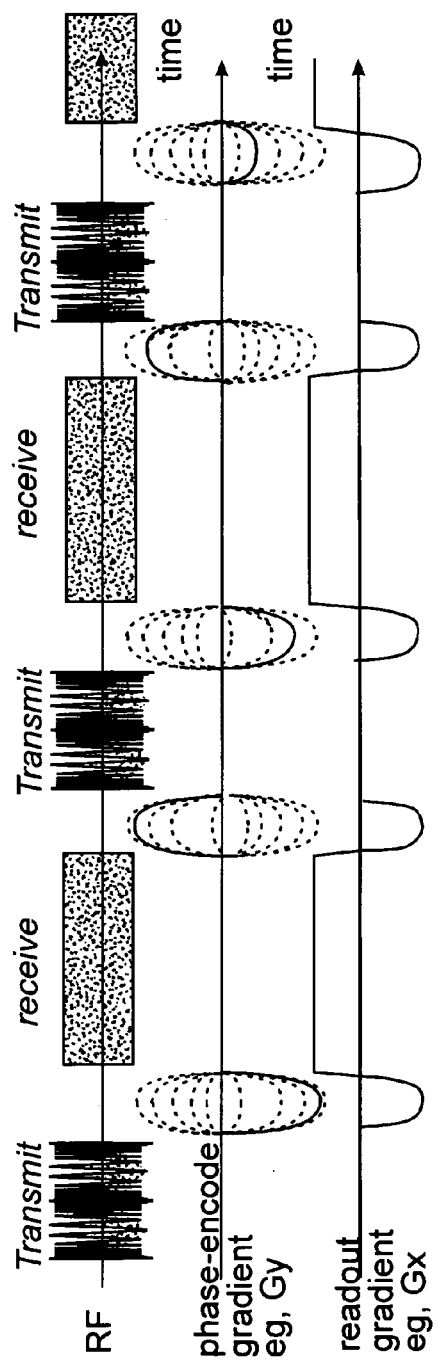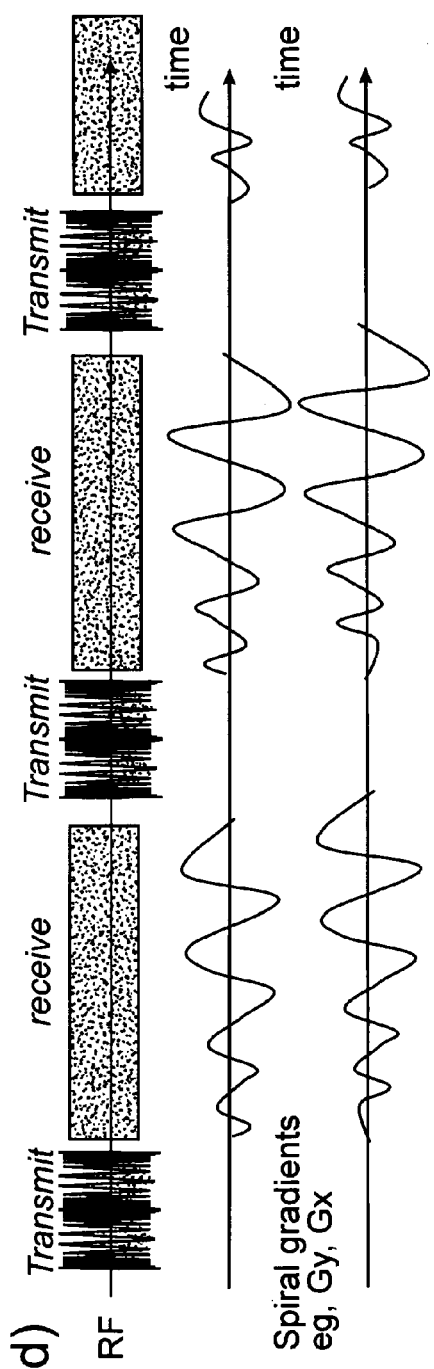

RF Transmission by a probe whose sensitivity is constrained to a disk excites a small volume. Reception of signal using the same probe ensures an image arising from this volume.

Reception profile of a loopless antenna probe in a homogeneous medium showing an eight-fold variation within ten mm.

Sensitivity of a bare loopless antenna with square pulse (top) and BIR-4 pulse (bottom). Non-uniformity is corrected by adiabatic pulse Numerical computation of flip angle produced by BIR-4 pulse shows a constant flip above a threshold $B_1$

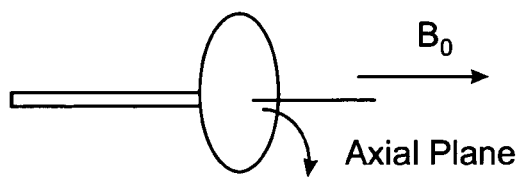
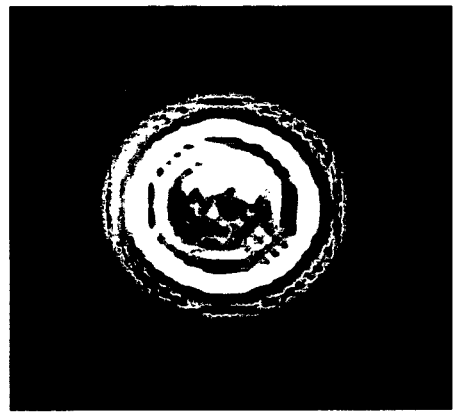
Regular pulse
Conventional RF transmission produces stripes in the image.
FIG. 19(a)
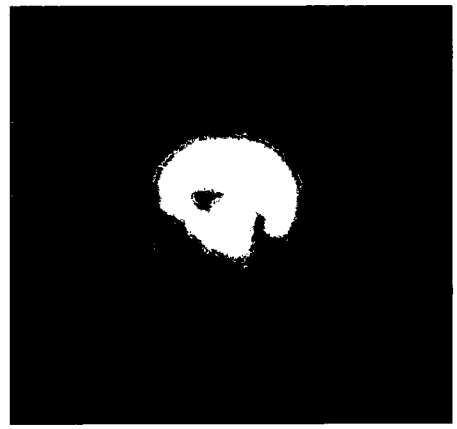
Adiabatic pulse
Adiabatic RF pulses corrects for the inhomogenous transmission profile.
FIG. 19(b)

Construction of a 'sleeve balun'. The length L is adjusted to obtain a high impedance at the antenna-whip junction. The matching network M is also shown in the figure.

Full-width-half-max excite slice width
of multiturn loop (left)
and modified loopless antenna (right) with
adiabatic excitation.

Numerical computation of SAR distribution of the loop (a)
and the loopless antenna (b).
Values (in W/Kg) have been normalised to 0.25W input power.
P1 and P2 show the location of sensors to measure
the temperature increase.

High resolution image of a kiwifruit. Slice localization arises entirely from constrained sensitivity of probe. TR=3s, TE = 12ms. FOV = 50mm. Nx = Ny = 200. In-plane resolution = 250um.

A portion of the kiwifruit of Fig 22 showing the blur that results when its axis is not oriented along the slice-select direction, i.e. the scanner bore.

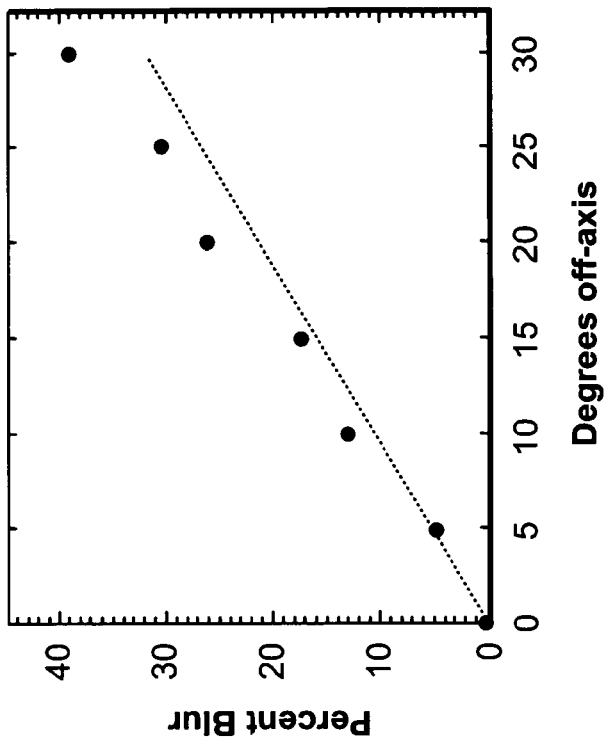
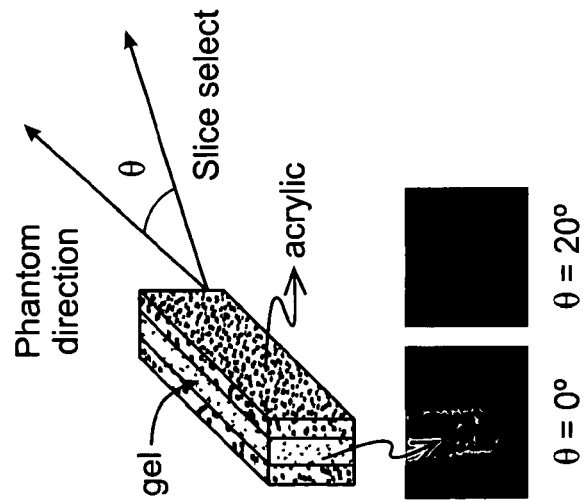
FIG. 24
The custom phantom used to quantify blur. A drop in image SNR is quantified as blur. A 25% blur at 20° off-axis results in image degradation as seen above. The dashed line represents a theoretical computation from the geometry of the phantom.

Depiction of the multiturn loop coil and the corresponding match network M. The loop axis is perpendicular to $B_0$.

Experimental SNR comparison of the probes in a homogeneous medium suggests that the loop was well suited for imaging small regions of interest (<1cm) while the loopless antenna offered a larger field-of-view.

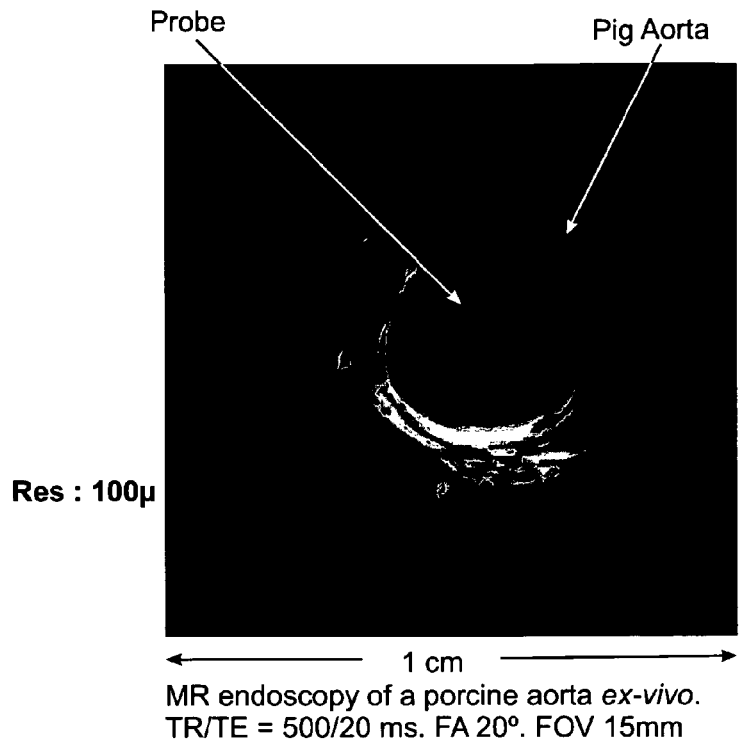
MR endoscopy of a porcine aorta *ex-vivo*.
TR/TE = 500/20 ms. FA 20°. FOV 15mm
FIG. 27
FIG. 28
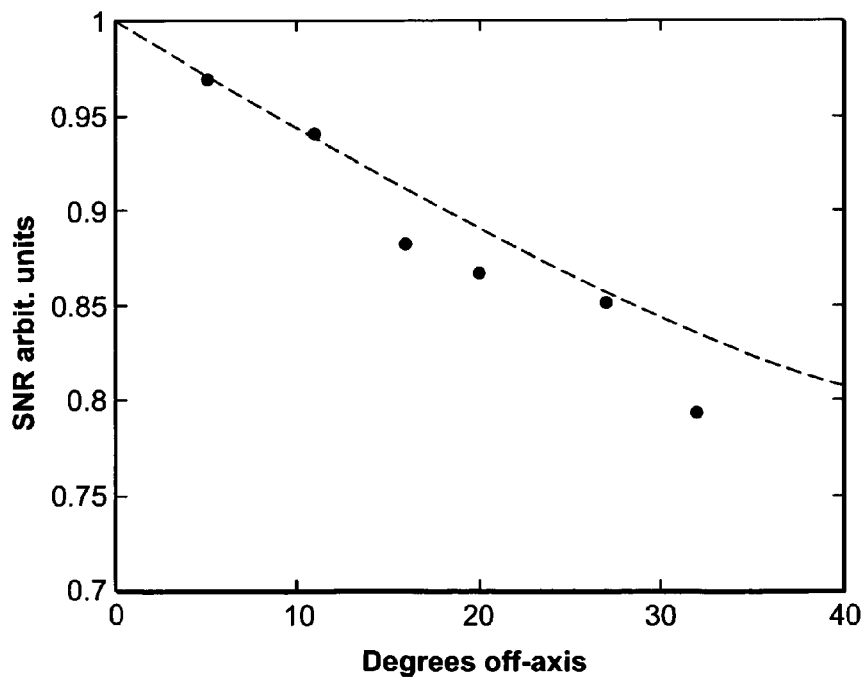
SNR drop when the loop probe moves off-axis with the scanner bore. The theoretical values were computed from near field analysis of the loop antenna.

METHODS, SYSTEMS AND DEVICES FOR LOCAL MAGNETIC RESONANCE IMAGING

This application claims the benefit of U.S. Provisional Application Ser. No. 60/877,733 filed Dec. 29, 2006, the teachings of which are incorporated herein by reference.

STATEMENT REGARDING FEDERALLY-SPONSORED RESEARCH

The present invention was supported by grants from the National Institute of Health (NCRR), grant number RO1-RR15396 and the National Institute of Health (NHLBI), grant number RO1-HL57483. The U.S. Government may have certain rights to the present invention.

FIELD OF INVENTION

The present invention relates to methods, systems and devices for magnetic resonance imaging (MRI) and more particularly relates to MRI methods, systems and devices in which a spatial coordinate frame of imaging is locked to an MRI probe introduced into the body or subject being imaged.

BACKGROUND OF THE INVENTION

Cardiovascular disease is a major cause of death and disability in the United States and in general in western civilizations, with the predominant etiology (i.e., the set of factors that contributes to the occurrence of a disease, considered the cause of a disease or abnormal condition) related to atherosclerosis. In regards to atherosclerosis, the site of the pathogenesis is primarily the arterial wall or wall of the blood vessel. Localized forms of the atherosclerotic disease, such as the deposit of plaque on the walls of blood vessels, can restrict local blood flow and require surgical intervention.

X-ray angiography wherein blood vessels are injected with a radio-opaque dye that outlines them on x-ray images, displays the passageway though the blood vessel (i.e., vessel lumen). While X-ray angiography is effective in detecting the luminal narrowing caused by plaque, this technique does not provide information regarding the nature, structure, or vulnerability to rupture of the processes that underlie vessel narrowing. More specifically, other than obtaining lumenographic measures, the vessel wall cannot be visualized and the atherosclerotic plaques cannot be characterized using X-ray angiography.

In this regard, anatomically the wall of an artery or blood vessel consists of three layers, the innermost consisting of an inner surface of smooth endothelium covered by a surface of elastic tissues: the two form the tunica intima. The tunica media, or middle coat, is thicker in arteries, particularly in the large arteries, and consists of smooth muscle cells intermingled with elastic fibers, where the muscle-cell and elastic fibers circle the vessel. The outer layer, the tunica adventitia, is the strongest of the three layers and is composed of collagenous and elastic fibers. The tunica adventitia provides a limiting barrier, protecting the vessel from over-expansion.

Also, therapeutic methods, such as intravascular intervention, may experience failure due to the lack of sufficiently precise imaging methods. An imaging system capable of providing detailed, qualitative and quantitative data regarding the status of vascular walls at the time of surgical intervention, could greatly improve efficacy by enabling the selection of the intervention method to be customized to the particular need. It also would serve to provide precise guidance for various forms of localized therapy.

In a limited number of applications, intravascular ultrasound (IVUS) is used to acquire images of the atherosclerotic plaques. J. R. Spears, H. J. Marais, J. Serur, O. Pomerantzelff, R. P. Geyer, R. S. Sipzener, R. Weintraub, R. Thurer, "In vivo coronary angioscopy," *J. Am. Coll. Cardiol.*, 1, 1311-1314 (1983). The resulting images, however, have several drawbacks, including the relative insensitivity to soft tissue and the inability to reliably detect and discriminate thrombus (new or organized) superimposed upon plaque from soft lipid-laden plaques, particularly in the presence of calcifications which are a common feature of the disease. Also, the presence of artifacts related to transducer angle relative to the vessel wall, and an imaging plane limited to the aperture of the transducer in variable resolution at different depths of view are further problems with this approach.

The feasibility of identifying atherosclerotic lesions by employing magnetic resonance (MR) microimaging in vitro has previously been suggested. See, for example, Pearlman et al., "Nuclear Magnetic Resonance Microscopy of Atheroma in Human Coronary Arteries," Angiology, Vol. 42, pp. 726-33 (1991); Asdente et al., "Evaluation of Atherosclerotic Lesions Using NMR Microimaging," Atherosclerosis, Vol. 80, pp. 243-53 (1990); and Merickel et al., "Identification and 3-d Quantification of Atherosclerosis Using Magnetic Resonance Imaging," Comput. Biol. Med., Vol. 18, pp. 89-102 (1988). It has also been demonstrated that MRI can potentially be used for quantification of atherosclerosis, for planning and targeting RF ablation therapies for cardiac arrhythmias, for MRI-guided coronary catheterization procedures, and even intravascular gene therapy. See, generally, Merickel et al., "Noninvasive Quantitative Evaluation of Atherosclerosis Using MRI and Image Analysis," Arteriosclerosis and Thrombosis, Vol. 13, pp. 1180-86 (1993); "Visualization and Temporal/Spatial Characterization of Cardiac Radiofrequency Ablation Lesions Using Magnetic Resonance Imaging" Lardo et al, Circulation. 2000; 102:698-705; "Real-Time Magnetic Resonance Imaging-Guided Coronary Catheterization in Swine" by Omary et al, Circulation 2003; 107:2656-2659; and "Magnetic Resonance Imaging Permits In Vivo Monitoring of Catheter-Based Vascular Gene Delivery" by Yang et al, Circulation. 2001; 104:1588-1590.

In addition to identification and the potential of MRI-guided intervention of atherosclerotic lesions, the vasculature can offer practical and/or minimally-invasive access via diagnostic and therapeutic catheters, needles, and other interventional devices, to cancerous and other lesions, to sites of injury or congenital abnormalities. These are areas where devices employing MR micro-imaging can potentially be of major benefit to disease diagnosis and intervention, by providing sub-millimeter resolution of pathologic tissues for biopsy, morphologic or functional MRI analysis, and precision guidance and delivery of therapy. Specific areas of potential value include brain tumors, arterio-venous malformations, aneurysms, tumors of the liver and pancreas, and congenital abnormalities.

Conventional clinical endoscopy permits the routine identification of, and minimally-invasive intervention for, suspect lesions in the gastro-intestinal tract, the bladder and other body cavities, as well as the guidance of laparoscopic procedures. It is responsible for identifying hundreds-of-thousands of new cancer cases in the USA annually [American Cancer Society; Cancer Facts and Figures 2007. Atlanta:

American Cancer Society; 2007. http://www.cancer.org/downloads/STT/CAFF2007PWSecured.pdf]. Current endoscopy procedures are performed with imaging modalities including the optical endoscope, optical coherence tomography (OCT) and IVUS. A difference between current MR micro-imaging approaches and existing IVUS, OCT, and optical endoscopy, is that the latter provide internal high-resolution examination directly from the viewpoint of the probe. On the other hand, existing intravascular MRI (IVMRI) cannot presently do this directly because localization depends entirely on the fixed external localizing MRI gradient coils and hence is intrinsically locked to the laboratory frame-of-reference (FoR) of the MRI scanner.

Further opportunities also exist for internal MR microimaging outside the vasculature, analogous to those applications currently served by conventional optical endoscopy. These include but are not limited to trans-esophageal MRI (see "Transesophageal Magnetic Resonance Imaging" by Shunk et al, Magn. Reson. Med 1999; 41:722-726), which can be used, for example, to visualize aortic lesions beyond the esophageal track which cannot be done by visual endoscopy (see "Statin-Induced Cholesterol Lowering and Plaque Regression After 6 Months of Magnetic Resonance Imaging-Monitored Therapy", Lima et al, Circulation. 2004; 110:2336-2341); transurethral MRI for investigating incontinence, disorders of the urinary tract, and bladder cancer (see "Endourethral MRI", Quick et al, Magnetic Resonance in Medicine 2001; 45:138-146); endorectal MRI for prostate cancer (see "Phased-Array MRI of Canine Prostate Using Endorectal and Endourethral Coils", Young et al, Magnetic Resonance in Medicine 2003; 49:710-715), and its extension to colon cancer. Indeed applications are not limited to blood vessels or body cavities or flexible devices as MR microimaging is practical with needle devices incorporating MRI antenna, for example, for performing MR-guided needle biopsies of tumors and/or treating them with hypo- or hyper-thermic therapy under MRI guidance; or indeed use of rigid cannula probes, to guide and locate electrodes under MRI-guidance to provide deep brain stimulation (DBS) as a treatment for Parkinson's disease (see "An Active Microelectrode System for Experimental MRI-Guided Intracranial Intervention", Karmarkar et al, Proc. Intl. Soc. Mag. Reson. Med. 2005; 13: 2162).

As is known to those skilled in the art, in a general sense MRI involves providing bursts of radio frequency (RF) energy on a specimen positioned within a main magnetic field in order to induce responsive emission of magnetic radiation from the hydrogen nuclei or other nuclei. The emitted signal can be detected in such a manner as to provide information as to the intensity of the response and the spatial origin of the nuclei emitting the responsive magnetic resonance signal. In general, imaging can be performed in a slice or plane, in multiple planes, or in a three-dimensional (3D) volume with information corresponding to the responsively emitted magnetic radiation being received by a computer which stores the information in the form of numbers corresponding to the intensity of the signal. The pixel value can be established in the computer using applications programs that embody any one of a number of mathematical processing techniques (e.g., typically Fourier Transformation, FT) which converts the signal amplitude as a function of time to signal amplitude as a function of frequency or spatial coordinates. The signals may be stored in the computer and may be delivered with or without enhancement to a display (e.g., CRT, LCD, plasma screen display, digital light projector). The image created from or by the computer output is presented through monochrome presentations with varying in intensity (e.g., gray scale presentation) or through color presentations with varying in hue and intensity. See also for example U.S. Pat. No. 4,766,381.

Yuan et al., "Techniques for High-Resolution MR Imaging of Atherosclerotic Plaques," J. Magnetic Resonance Imaging, Vol. 4, pp. 43-49 (1994) discloses a fast spin echo MR imaging technique to image atherosclerotic plaques on an isolated vessel that has been removed by carotid endarterectomy. It has also been suggested that the fat content of atherosclerotic plaque in excised tissue samples can be determined using chemical shift imaging or chemical shift spectroscopy. See, generally, Vinitski et al., "Magnetic Resonance Chemical Shift Imaging and Spectroscopy of Atherosclerotic Plaque," Investigative Radiology, Vol. 26, pp. 703-14 (1991); Maynor et al., "Chemical Shift Imaging of Atherosclerosis at 7.0 Tesla," Investigative Radiology, Vol. 24, pp. 52-60 (1989); and Mohiaddin et al., "Chemical Shift Magnetic Resonance Imaging of Human Atheroma," Br. Heart J., Vol. 62, pp. 81-89 (1989).

The foregoing non-patent articles in the aggregate could lead one skilled in the art to conclude that MR, while having potential for fully characterizing vessel wall disease, suffers from low anatomic resolution unless used in vitro on small specimens with high resolution methods. Also, while MRI techniques should make it possible to distinguish between the three layers of the vessel wall and detect atherosclerotic lesions (even before they calcify), the signal-to-noise-ratio (SNR) that is obtained when using standard receiver coils (e.g., surface or local coils) is presently not sufficiently high for the desired resolution. In some of these MRI techniques, a small receiver probe or coil is introduced into a blood vessel such as by means of a catheter which is then utilized to image the arterial wall. Most of these coils or probes have a size and mechanical design constraints that do not allow them to be used to image small blood vessels.

There has been described a intravascular catheter antenna design (e.g., a loopless antenna design) that can be made very thin and whose electromagnetic (EM) properties are virtually independent of its diameter. It also has been reported that this antenna design provides useful SNR in a cylindrical volume around the catheter. Ocali O, Atalar E, "Intravascular Magnetic Resonance Using a Loopless Catheter Antenna", Magnetic Resonance in Medicine 37, 112-118 (1997).

There also is described in U.S. Pat. No. 5,928,145 (the teachings of which are incorporated herein by reference), methods for MRI and spectroscopic (MRS) analysis as well as a corresponding apparatus and magnetic resonance antenna assembly. Such imaging methods include positioning a specimen within a main magnetic field and introducing an antenna having a loopless antenna portion in close proximity to the specimen. RF pulses are provided to the region of interest to excite MR signals, gradient magnetic pulses are applied to the region of interest with the antenna receiving MR signals and emitting excitation signals. A processor processes the responsive output signals to provide image information for display in a desired manner. In a preferred use the antenna having a loopless antenna portion is introduced into small blood vessels of a patient to facilitate determination of atherosclerotic plaque.

While existing internal clinical imaging devices such as endoscopes and IVUS, provide internal high-resolution examination directly from the viewpoint of the inserted probe, in conventional MRI (including that done using the loopless antenna) the image FoR is locked to the coordinate system of the MRI scanner (i.e., the scanner coordinate system). This means that imaging from the viewpoint of an introduced internal MRI antenna or probe cannot be done without performing an interrogation to determine the probe's location in the scanner frame, followed by feedback and computation of new position coordinates to feed to the system's external gradient coils, before local MRI from the probe's viewpoint can be done. This process is inefficient in imaging time where real-time imaging from the site of the probe is required, and also costs valuable signal-to-noise ratio (SNR) when the time spent locating the signals could be better spent on signal averaging to improve SNR. Additionally RF power deposition from MRI pulses applied by the body coil is a significant issue with internal antenna probes, due to coupling of the fields induced in the large volume of the body, with the internal probe. In some cases as described for example, in U.S. Pat. No. 5,928,145, data for multiple slices can be acquired while the antenna or probe is maintained fixed at a single location within the specimen or body.

It thus would be desirable to provide new systems, signal detection devices and methods for MRI in which the FoR is not locked to the scanner or its coordinate system but rather is locked to a small MRI probe or signal detection device analogous to an endoscope. It would be particularly desirable to provide such devices and methods that would allow the feed-back/interrogation process associated with conventional MRI techniques and devices to be eliminated. It also would be particularly desirable to provide such methods and devices that also would restrict RF excitation to the small volume over the probe itself. Such detection devices preferably would be simple in construction and such methods would not require development of skills above and beyond those normally exercised by those of ordinary skill in the art.

SUMMARY OF THE INVENTION

The present invention features an MRI signal detection device, an imaging system using such a device, and MRI methods. The MRI method of the present invention includes introducing an MRI antenna probe into the body or subject to be imaged and imaging the body or subject in such a way that the spatial FoR for imaging is effectively locked to the introduced MRI antenna probe. More particularly, the MRI antenna probe is configured and arranged so that the spatial FoR of imaging is inherently locked to the introduced MRI antenna probe. Stated another way, the MRI antenna probe is configured and arranged so that an imaged slice is localized with respect to the MRI antenna probe.

In further embodiments, such imaging is conducted so that the MRI signal is confined substantially to a region around the probe. In this way, the MRI according to the present invention is done from the viewpoint of the probe. Thus, interrogation and feedback of the location of the imaging FoR relative to the scanner FoR or coordinate system is not required or essential, as distinct from conventional MRI techniques, where the spatial coordinate FoR for imaging is locked to the scanner coordinate system.

Consequently, the MRI antenna probe of the present invention becomes, essentially, an "MR-eye" that can generate images of what the probe "sees" as the probe is being introduced and directed towards a desired target in the fashion of an MRI "endoscope". The MRI methods of the present invention are adaptable for use in imaging of plaques, cancerous lesions, and other pathologies, as well as being usable for MRI-guided delivery of therapies. The present invention embodies the elements of MRI pulse sequence design as well as MRI probe designs that benefit from the incorporation of high-SNR internal MRI detectors, which are ideally suited to MRI endoscopy.

It also is contemplated and thus within the scope of the present invention for such image techniques and devices to be used in conjunction with any of a number of medical intervention and treatment techniques known to those skilled in the art. For example, medical intervention such as laser hyper- or hypo-thermic therapies, chemo-therapeutic, RF or thermal ablation of the undesired pathology, may be employed. Similarly, any normal diagnostic or therapeutic measures undertaken with the aid of an endoscope (not shown), may be accomplished substantially simultaneously with the use of such imaging techniques and devices for imaging and/or spectroscopic analysis, as noted in the "Background" above.

In yet further embodiments, the MRI methods of the present invention include introducing an MRI detection device within the specimen and acquiring image data while a spatial coordinate FoR is intrinsically locked to the introduced MRI detection device. In particular embodiments, the detection device includes a loopless antenna that is introduced into the specimen. Also, said providing a loopless antenna also includes configuring the loopless antenna so that the spatial coordinate FoR is locked to the introduced loopless antenna. Further, such configuring further includes providing a spoiling RF and/or magnetic field effect along a substantial length of the loopless antenna except from an area where signal is desired.

Such methods also can further include confining the MRI signal substantially to a predetermined shaped volume about a predetermined portion of the MRI detection device. More particularly, confining the MRI signal substantially to a predetermined shaped volume about the area of the loopless antenna where signal is desired.

Such configuring of a loopless antenna also can further include one of the following. Such configuring includes coating a material (e.g., a magnetic material) along a substantial length of the loopless antenna except the area where signal is desired, where the material has desired magnetic properties. More particularly, the material coating the substantial length of the loopless antenna is one of a strongly paramagnetic material or a ferromagnetic material.

Such configuring also includes embedding at least one small permanent magnet along a substantial length of the loopless antenna except the area where signal is desired. In more particular embodiments, a plurality of permanent magnets are embedded, where the permanent magnets are arranged so as to be disposed on regions adjacent to the area where signal is desired. Also, the plurality of permanent magnets are embedded about the circumference of the loopless antenna as well as along the length of the loopless antenna.

In further embodiments, such a loopless antenna further includes a sleeve member and an antenna portion, where the sleeve member incorporates electrically conductive material and is configured so as to extend about an exterior surface of the antenna portion and also to extend along a substantial length of the antenna portion. In yet further embodiments, such a sleeve member additionally includes a coating of or incorporate the above described material or the at least one permanent magnet. Also, the sleeve member is so composed with such material or permanent magnet and arranged on the antenna portion except in area where signal is desired.

In further embodiments, the antenna portion includes a first portion and a second portion, the first portion extending from the second portion. The first portion is configured so as to have a predetermined length and wherein the coating, at least one permanent magnet or sleeve member is arranged so that the area where signal is desired is located at or about the first end of the first portion and between said first end and the second portion. Also, the predetermined length is established so as to be equal to about a fraction of the EM wavelength ($\lambda$) of responsive emissions in the specimen from the nuclei of the tissue being imaged in the area where signal is desired, more particularly the predetermined length is about equal to about $\lambda/4$. In further embodiments, the first portion includes a conductive member that extends from the second portion and the first portion conductive member is arranged so as to extend along a long axis thereof or is arranged so as to extend about and along the long axis so as to form, for example, a helical structure.

Such configuring also can include coiling an additional electrically conducting wire along a substantial length of the loopless antenna except the area where signal is desired. For example, the wire is coiled about the loopless antenna to form wire coils in regions adjacent to the area where signal is desired. In further embodiments, a wire extends between and interconnects the coiled wired in the adjacent regions, such an interconnecting wire is not coiled. The wire also is coiled so that a spoiling gradient magnetic field is created when the wire coils are energized by a low-frequency (DC-200 kHz range) low-power current waveform.

Such configuring also can include coiling wire along a substantial length of the loopless antenna except the area where signal is desired. For example, the wire is coiled about the loopless antenna to form wire coils in regions adjacent to the area where signal is desired. In further embodiments, a wire extends between and interconnects the coiled wired in the adjacent regions, wherein such an interconnecting wire is not coiled. The wire is coiled such as to provide for a substantially different magnetic field in the region of the interconnecting wire, as compared to the regions where the wire is coiled, when the wire coils are energized.

In further embodiments, the MRI detection device is further configured to apply RF signals to a region of interest so as to thereby excite MR signals within the specimen in the region of interest. More particularly, the MRI detection device is further configured to transmit RF signals from the loopless antenna and from the area where signal is desired so as to thereby excite MR signals within the specimen in a region about the area where signal is desired.

As indicated above, the acquisition of image data is accomplished without reference to the FoR of the scanner coordinate system in at least one dimension. Also, said acquiring image data includes acquiring image data as the detection devices travels along a path within the specimen. More particularly, acquiring image data includes acquiring image data as the loopless antenna travels along a path within the specimen and also, such data is acquired without reference to the FoR of the scanner coordinate system in at least one dimension.

In yet further embodiments, the present invention features a method of MRI of a specimen that includes providing an MRI scanner including an external excite coil and an MRI probe, the MRI scanner and probe being arranged and configured so that a spatial coordinate frame is inherently locked to the MRI probe and so the MRI signal is confined substantially to a predetermined shaped volume of the specimen about the MRI probe. Also, such a method includes dephasing magnetization of the signals detected by an MRI probe over a substantial region of its MRI-sensitive length, except for another region having a length for which signal selection is required, whereby the length of the another region establishes a third dimension of the shaped volume.

Such dephasing magnetization of the MRI probe also includes dephasing the magnetization by coating the MRI probe with a material over a substantial region of its MRI-sensitive length except for the length of the said another region for which signal selection is required. Alternatively, such dephasing magnetization of the MRI probe includes dephasing the magnetization by changing a local magnetic field by providing at least one permanent magnet on the MRI probe, located in a region(s) on the probe where the signal is to be substantially eliminated.

Such a method also includes selectively transmitting RF signal pulses from the MRI probe and selectively receiving MRI signals from the shaped volume and providing an MR pulse sequence so as to thereby 2D spatially encode in the radial and azimuthal directions relative to the probe. Such providing an MR pulse sequence so as to thereby 2D spatial encode in the radial and azimuthal directions includes providing an MR pulse sequence comprised of a variable amplitude hard pulse, followed by a string of 180° transmit pulses alternately applied from the external RF excite coil and the MRI probe. In further embodiments, such a method also includes reconstructing an image from said predetermined shaped volume which is substantially localized to the FoR of said MRI probe.

In yet further embodiments, such dephasing magnetization of the MRI probe includes providing a spoiling gradient winding on the MRI probe over a substantial region of its MRI-sensitive length except for the length of the another region for which signal selection is required, and exciting said gradient winding during MR transmission. Such providing an MR pulse sequence so as to thereby 2D spatial encode in the radial and azimuthal directions relative to the probe, includes phase encoding and applying read-out gradients by the MRI scanner in the FoR of the MRI scanner. Also included is reconstructing an image from said predetermined shaped volume which is substantially localized to the FoR of said MRI probe.

In yet further embodiments, the present invention features a method of MRI of a specimen in 3D. Such a method includes providing an MRI scanner including an external excite coil and an MRI probe, the MRI scanner and probe being arranged and configured so a spatial coordinate frame is inherently locked to the MRI probe's FoR and so the MRI signal is confined substantially to an extended volume of the specimen coaxial with the MRI probe. Such a method also includes selectively transmitting RF signal pulses from the MRI probe and selectively receiving MRI signals from the shaped volume, providing an MR pulse sequence so as to thereby 2D spatial encode in the radial and azimuthal directions relative to the probe, and spatial-encoding in the form of a read-out gradient being provided in the third dimension by changing a local magnetic field.

Such spatial-encoding in the form of a read-out gradient being provided in the third dimension includes providing a variable-pitch gradient winding on the MRI probe over a substantial region of its MRI-sensitive length, and exciting said gradient winding during MR reception so that a Fourier transform (FT) of each received signal is proportional to a projection of the MRI signal distribution along the axis of the wire. Such providing an MR pulse sequence so as to thereby 2D spatial encode in the radial and azimuthal directions includes providing an MR pulse sequence comprised of a variable amplitude hard pulse, followed by a string of 180° transmit pulses alternately applied from the external RF excite coil and the MRI probe. Such methods also includes reconstructing an image from said predetermined shaped volume which is substantially localized to the FoR of said MRI probe.

In yet further embodiments, the present invention features a method of MRI of a specimen including providing an MRI scanner including an external excite coil and an MRI probe, the MRI scanner and probe being arranged and configured so a spatial coordinate FoR is inherently locked to the MRI probe and so the MRI signal is confined substantially to an extended volume of the specimen coaxial with the MRI probe. Also, such an MRI probe also includes opposed solenoid coil windings on the body of the probe. Such methods also can further include exciting the opposed solenoid coil windings with a direct or low-frequency (<200 kHz, as is known to those skilled in the art of MRI) current during RF transmission so as to provide a substantially linear magnetic field gradient, thereby providing a substantially disk-shaped slice-selection in a third dimension.

Such methods also include selectively transmitting RF signal pulses from the MRI probe and selectively receiving MRI signals from the extended volume and providing an MR pulse sequence so as to thereby 2D spatial encode in the radial and azimuthal directions relative to the probe. Such providing an MR pulse sequence so as to thereby 2D spatial encode in the radial and azimuthal directions includes providing an MR pulse sequence comprised of a variable amplitude hard pulse, followed by a string of 180° transmit pulses alternately applied from the external RF excite coil and the MRI probe. Such methods also further includes reconstructing an image from said extended volume which is substantially localized to the FoR of said MRI probe.

In yet further embodiments, there is featured a method of MRI of a specimen including providing an MRI scanner including an external excite coil and an MRI probe, the MRI probe being arranged and configured so as to provide a non-uniform sensitivity profile and the MRI scanner and probe being arranged and configured so a spatial coordinate frame is quasi-locked to the MRI probe and so that the MRI signal is confined substantially to a disk-shaped volume of the specimen. Such a method also includes selectively transmitting RF signal pulses from the MRI probe and selectively receiving MRI signals from a portion of the volume about the MRI probe, 2D spatially encoding by phase encoding the volume to be imaged, providing slice-shaped selection in a third dimension with use of at least one adiabatic excitation from the MRI probe combined with the non-uniform sensitivity profile of the probe, and applying read-out gradients by the MRI scanner in the FoR of the MRI scanner. Such a method further includes reconstructing an image from said slice-shaped region which is substantially localized to the FoR of the MRI probe and shifting the field-of-view (FOV) of the reconstructed images to the center of the probe by post-processing means.

In particular further embodiments, such providing an MRI probe having the non-uniform sensitivity profile, includes one of the following.

(1) coating the probe over a substantial region of its MRI-sensitive length except for a portion from which signal selection is desired, and wherein said coating dephases the magnetization from adjacent regions;

(2) providing at least one small permanent magnet on the MRI probe, located in regions on the probe where the signal is to be substantially eliminated thereby dephasing the magnetization by changing the local magnetic field;

(3) providing a spoiling gradient winding on the MRI probe over a substantial region of its MRI-sensitive length except for a length at the region for which signal selection is required, and exciting said gradient winding during MR transmission, thereby dephasing the magnetization by changing the local magnetic field;

(4) providing opposed solenoid coil windings on the body of the probe and exciting the gradient with low-frequency or direct current during RF transmission to provide a substantially linear magnetic field gradient and performing slice localization using the gradient; or (5) providing a sleeve portion that incorporates electrically conducting material to spoil the RF magnetic field except in the area where signal is desired, wherein said electrically conducting material is separated from the loopless antenna by a dielectric material.

In particular further embodiments, such providing an MRI probe having the non-uniform sensitivity profile includes providing opposed solenoid coil windings on a body of the MRI probe for RF transmission. Also, such providing slice-shaped selection in a third dimension includes providing a first adiabatic pulse followed by a second adiabatic pulse wherein the second adiabatic pulse is adjusted to be 180° over the sensitive region of interest, and wherein the second pulse is preceded and followed by gradient crusher pulses.

In yet further aspects, the present invention features an MRI scanner for providing images where the spatial coordinate FoR is locked to a MRI probe with respect to at least one dimension. Such an MRI scanner includes an external MR coil and transmission means for providing transmit MR signals to the external MR coil and to the MRI probe when disposed local to a volume to be imaged.

In yet further aspects, the present invention features an MRI probe where a spatial coordinate FoR is inherently locked to the MRI probe. Such an MRI probe includes a magnetic coating to dephase MRI signals away from a region of interest. More particularly, the magnetic coating is applied to the MRI probe over a substantial region of its MRI-sensitive length except for a length at another region for which signal selection is required. Alternatively, the magnetic coating is applied to the MRI probe over a substantial region of its MRI-sensitive length except for a portion from which signal selection is desired, and wherein the magnetic coating dephases the magnetization from adjacent regions.

In particular embodiments, such an MRI probe further includes a loopless antenna. Also, the magnetic coating is applied to the loopless antenna one of (a) over a substantial region of its MRI-sensitive length except for a portion thereof region for which signal selection is required or (b) over a substantial region of its MRI-sensitive length except for a portion from which signal selection is desired, where the magnetic coating dephases the magnetization from adjacent regions.

In yet further embodiments, there is featured an MRI probe where a spatial coordinate frame is inherently locked to the MRI probe. Such an MRI probe includes one or more permanent magnets to dephase MRI signals away from a region of interest. The one or more permanent magnets are arranged so as to be over a substantial region of a MRI-sensitive length of the MRI probe except for a length at another region for which signal selection is required. Alternatively, the one or more permanent magnets are arranged over a substantial region of a MRI-sensitive length of the MRI probe except for a portion from which signal selection is desired, and wherein the magnetic coating dephases the magnetization from adjacent regions. Also, such MRI probes can include a plurality of permanent magnets.

In particular embodiments, such an MRI probe further includes a loopless antenna. Also, the one or more permanent magnets are arranged one of (a) over a substantial region of an MRI-sensitive length of the loopless antenna except for a portion thereof for which signal selection is required or (b) over a substantial region of an MRI-sensitive length of the loopless antenna except for a portion from which signal selection is desired, where the magnetic coating dephases the magnetization from adjacent regions.

There also is featured an MRI probe including a body and a spoiling gradient winding. The spoiling gradient winding is arranged over a portion of an MRI-sensitive length of the body, wherein the spoiling gradient is provided for dephasing and/or encoding MRI signals. Such an MRI probe further includes a loopless antenna, where the spoiling gradient winding is arranged over a portion of the loopless antenna for dephasing and/or encoding MRI signals.

In yet another aspect, the present invention features a MR loopless antenna device that includes a coaxial cable having an outer shield and an inner conductor, with a portion of the outer shield and a portion of the inner conductor forming an antenna portion, the antenna portion at least for receiving MR signals emitted from a specimen, and emitting signals that excite MR in a specimen. Also, at least the antenna portion is configured so that the spatial coordinate FoR for imaging in at least one dimension is locked to the antenna portion.

In further particular embodiments, such a MR loopless antenna device includes a cylindrical conductor that is electrically coupled with another portion of the inner conductor and where the outer shield portion includes an inner primary shield and an outer secondary shield, each of the inner primary shield and outer secondary shield being coaxial with the inner conductor. Also, the coaxial cable includes having an electrical insulator or dielectric disposed between the inner primary shield and outer secondary shield. Additionally, an external diameter of the coaxial cable is structured to be received within a blood vessel of a patient.

In further embodiments of such MR loopless antenna devices the antenna portion is structured and configured so that a spoiling magnetic field is provided along a substantial length of the antenna portion except from an area where signal is desired. In more particular embodiments, the antenna portion further includes one of:

(1) a coating along a substantial length of the loopless antenna except the area where signal is desired with a material having desired magnetic properties, for example, a material that is a strongly paramagnetic material or a ferromagnetic material;

(2) at least one permanent magnet, each of the at least one permanent magnet being embedded along a substantial length of the loopless antenna except the area where signal is desired;

(3) a wire that is coiled about and along a substantial length of the antenna portion except the area where signal is desired, the wire being coiled so as to create a spoiling gradient magnetic field; or (4) a wire that is coiled about and along a substantial length of the antenna portion except the area where signal is desired, the wire being arranged to create a substantially linear magnetic field gradient.

Also featured are systems and apparatus embodying such methods, probes and devices.

Other aspects and embodiments of the invention are discussed below.

DEFINITIONS

The present invention is most clearly understood with reference to the following definitions:

MRI shall be understood to mean magnetic resonance imaging (also sometimes referred to as Nuclear Magnetic Resonance Imaging—NMRI), and generally describes and imaging technique that involves the transmission of radio-frequency (RF) magnetic fields into a specimen (e.g., the patient's body) while the specimen is subjected to a strong static magnetic field, wherein the RF magnetic field is tuned to excite the magnetic resonance (MR) frequency of a particular nuclear species of interest such as the nuclei of hydrogen (protons). The MRI/NMRI technique makes use of the fact that after the selected nuclei composing the specimen (e.g., hydrogen nuclei) are excited by the applied RF magnetic field, they "relax" back to equilibrium by emitting a RF magnetic field at the same frequency. The nucleus most commonly employed in MR is the proton in the hydrogen atom, because the hydrogen nucleus has the largest magnetic moment for its spin, has the highest concentration in the body, and thus provides the strongest resonance signals. Other nuclei used include but are not limited to those of phosphorus (phosphorus-31), carbon-13, oxygen-17 and fluorine (fluorine-19). A computer analyzes the emissions from, for example, the hydrogen nuclei of water molecules in body tissues and constructs images of anatomic structures based on the concentrations of such nuclei.

The term specimen shall be understood to mean any object other than the loopless antenna of the present invention, gradient magnetic coils and related structures that are placed in the main magnetic field for imaging (MRI) or spectroscopic (MRS) analysis and shall expressly include, but not be limited to members of the animal kingdom, including humans; test specimens, such as biological tissue, for example, removed from such members of the animal kingdom; and inanimate objects or phantoms which may be imaged by MR techniques, or which contain water or sources of other sensitive nuclei.

The term patient shall be understood to include mammalians including human beings as well as other members of the animal kingdom.

The term body coils shall be understood to include any antenna that generates a highly uniform RF magnetic field around the region of interest.

The term MR analysis shall be understood to include or embrace both imaging and spectroscopy (MRS) by producing chemical shift spectra.

The term hard pulse shall be understood to mean an RF pulse which is non-adiabatic and non-slice/frequency selective as is known to those skilled in the art. Such pulses commonly have a short duration which may be less than or comparable 1 msec, and a square profile.

The term adiabatic pulse shall be understood to mean adiabatic RF pulses, which are a special type of RF pulses that elicits a uniform MRI flip angle over a substantial range of amplitude in the applied magnetic field strength, or power level. This is especially useful for RF transmission from the surface body coils. See M. Garwood, K. Ugurbil, A. R. Rath, M. R. Bendall, S. L. Mitchell and H. Merkle, "Magnetic Resonance Imaging With Adiabatic Pulses Using a Single Surface Coil for RF Transmission and Signal Detection," Magnetic Resonance in Medicine, 9 (1):25-34, 1989.

BRIEF DESCRIPTION OF THE DRAWING

For a fuller understanding of the nature and desired objects of the present invention, reference is made to the following detailed description taken in conjunction with the accompanying drawing figures wherein like reference character denote corresponding parts throughout the several views and wherein:

FIG. 7(a) is a schematic view of a loopless catheter antenna according to another embodiment of the present invention.

FIG. 7(b) is an illustrative view illustrating the variation of the magnetic field as a function of distance along the loopless catheter antenna of FIG. 7(a).

FIG. 8(a) is a schematic view of a loopless catheter antenna according to another embodiment of the present invention.

FIG. 8(b) is an illustrative view illustrating the variation of the magnetic field as a function of distance along the loopless catheter antenna of FIG. 8(a).

FIGS. 13(a)-(d) are various figures illustrating MRI pulses sequences usable for endoscopic MRI in accordance with the present invention.

FIGS. 19(a)-(b) are illustrations of images produced by conventional RF excitation with a square pulse (19(a)), and with an adiabatic RF pulse (19(b)).

FIG. 24 includes various illustrative views illustrating the custom phantom used to quantify blur (left) and illustrating image degradation (right). A drop in image SNR is quantified as blur. The dashed line represents a theoretical computation from the geometry of the phantom.

FIG. 27 is an illustration of a 3 T MR endoscopic image of a porcine aorta using a loop probe in accordance with the present invention (TR/TE=500/20 ms; FA 20°; FOV=15 mm).

FIG. 28 is a graphical view of SNR versus degrees off-axis. SNR drop when the loop probe moves off-axis with the scanner bore. The theoretical values were computed from near field analysis of the loop antenna.

DESCRIPTION OF THE PREFERRED EMBODIMENT

Figure 1:
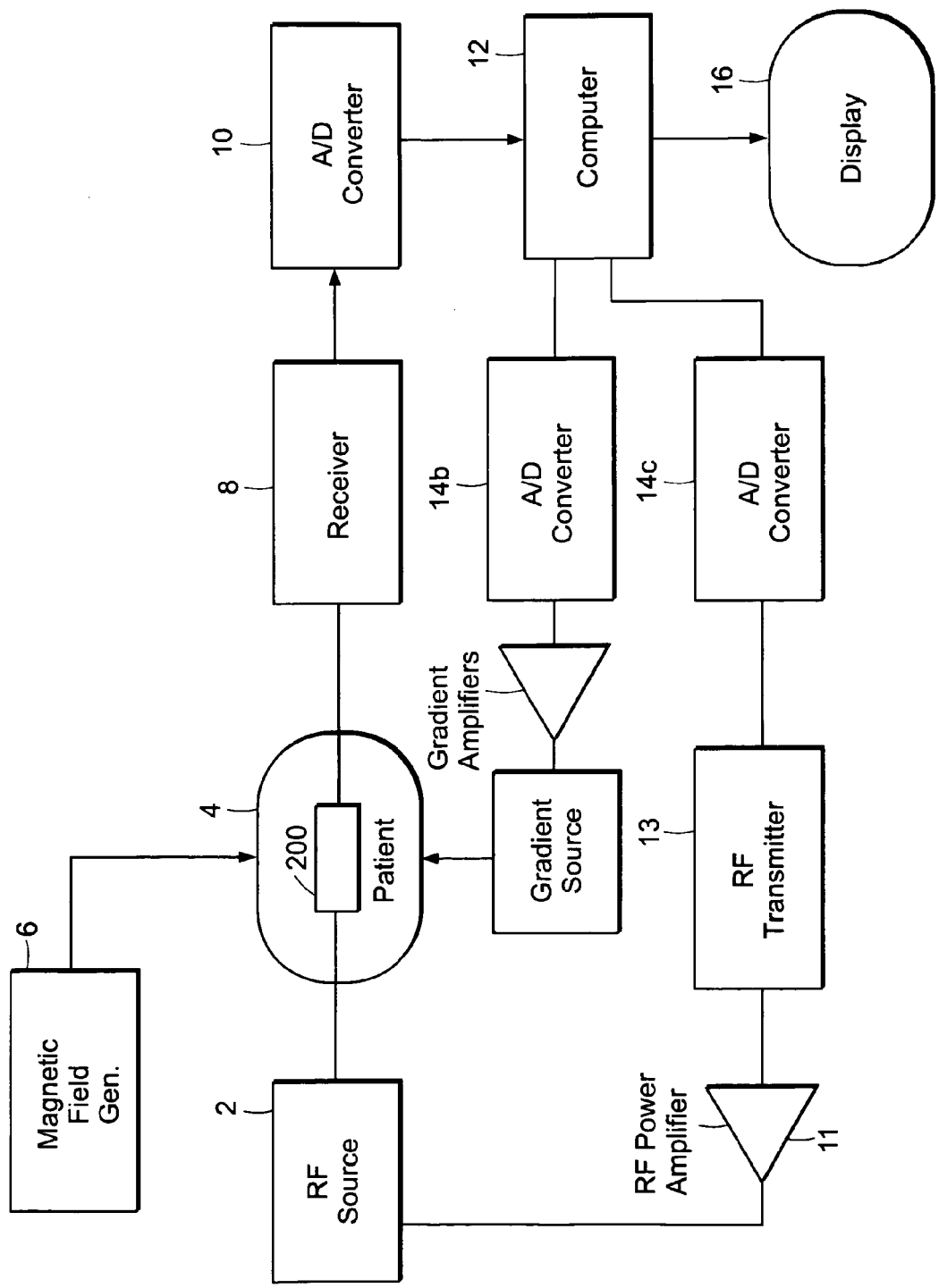
FIG. 1 is a schematic illustration of an MR system as is known to those skilled in the art.

Referring now to the various figures of the drawing wherein like reference characters refer to like parts, there is shown in FIG. 1 a schematic illustration of a MR system as is known to those skilled in the art which also generally illustrates the concept of MRI or MRS. Such an MR system includes a RF source 2, magnetic field generator(s) 6 (e.g., main and gradient magnetic field generators), a receiver 8, a signal processing mechanism and a display device 16.

The RF source 2 provides pulsed RF energy to the specimen which, in the form shown, is a patient 4 in the main magnetic field which is created by magnetic field generator 6. The RF energy is provided by an RF power amplifier 11, which is in turn fed by an RF transmitter 13, with analog signals converted in digital-to-analog (D/A) converters 14a from the MRI scanner's main computer 12. The specimen is generally aligned with the main magnetic field and the RF pulses are imposed perpendicular thereto. Where oblique imaging is employed, the angle of impingement of the vector representing the spatial gradient in the magnetic field will be angularly offset relative to the main field. This arrangement results in excitation of the nuclei within the region of interest, which is the area or volume to be imaged, and causes responsive emission of magnetic energy which is picked up by the receiver 8.

The receiver 8 is connected to an antenna or coils 200 (e.g., a catheter antenna) which has a voltage induced in it as a result of such responsive emissions of magnetic energy. The signal emerging from the receiver 8 passes through the signal processing mechanism. In the illustrated embodiment, the signal processing mechanisms includes an analog-to-digital (A/D) converter 10 and a computer. The signal emerging from the receiver 8 is typically an analog signal so the A/D converter 10 converts the analog signal to a digital signal for processing within the computer 12.

The computer 12 typically includes one or more applications programs for execution therein, which applications programs typically control image acquisition and signal processing. The applications programs for signal processing can include for example, instructions and criteria for performing FT image construction in one, two or three dimensions, wherein the plot of amplitude versus time corresponding to the incoming signals is converted by FT to a map of the spatial distribution of the signals by plotting amplitude versus frequency or phase in one, two or three dimensions. The FTs are performed in order to establish the MR signal intensity values and the locations of specific pixels. These values may be stored, enhanced or otherwise processed and emerge to be displayed on a suitable screen or display 16. The display can be any of a number of devices or systems known to those skilled in the art, including a cathode-ray tube, a liquid crystal display device, a plasma display device or digital projection device such as that embodying DLP technology.

Figure 2:
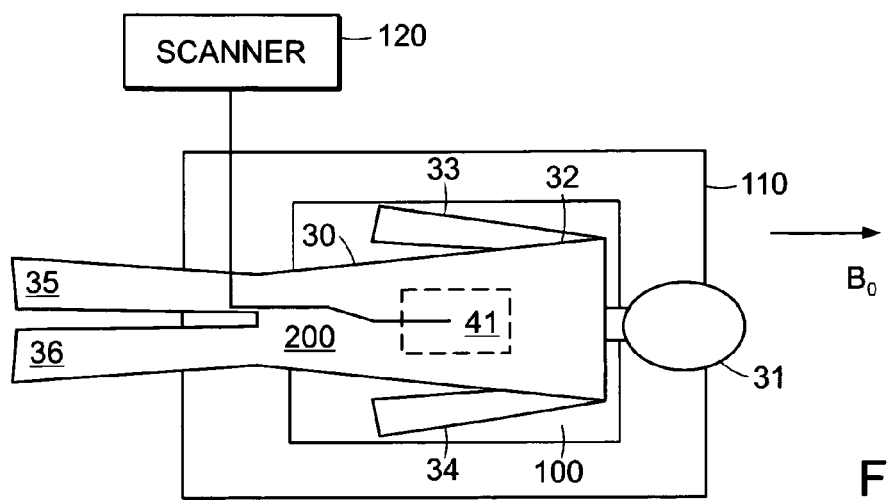
FIG. 2 is a schematic illustration of a catheter and loopless catheter antenna of the present invention associated with a body coil and magnet.

As shown in FIG. 2, a specimen 30, which in the illustrated case is a human being, has a head 31, a trunk 32, arms 33, 34, and legs 35, 36. The specimen 30 is disposed adjacent to a body coil 100 within the main magnetic field generated by magnet 110. The magnet 110 may be any magnet suitable for use in a MRI scanner, such as a permanent magnet, a superconductor or a resistive magnet, for example. A catheter antenna 200 which may be a loop or a loopless catheter antenna has been introduced into the patient 30 in a conventional manner through the femoral artery and into the trunk 32 with the antenna being adjacent to the region of interest 41. It should be recognized that this is illustrative and that a catheter antenna 200 of the present invention is adaptable so as to be inserted through a naturally existing openings such as a pancreatic duct (e.g., accessible during surgery on the duodenum), bile duct, urethra, urethra, esophagus, the bronchial passages and the like, or a man-made opening such as a catheter sleeve opening in the femoral or other artery, or into the abdomen etc.

The catheter antenna 200 is operatively associated with a MR scanner 120. In a preferred embodiment, the long axis of the catheter antenna 200 is generally aligned with the main magnetic field $B_0$. In this preferred alignment, for example, the sensitivity of the loopless antenna is orthogonal to $B_0$ and is therefore suitable for MR. Similarly, in generally preferred embodiments, it should be understood that the alignment of catheter antennae is such that they have a $B_1$ RF field sensitivity to MR signals whose magnetic fields are oriented in planes orthogonal to $B_0$. The catheter antenna 200 of the present invention also may be employed with any of a number encoding methods known to those skilled in the art. In regards to the description herein, reference numeral 200 is used when describing or referring to a catheter antenna of the present invention; however, an alpha or letter character is used in conjunction with reference numeral 200 when referring to specific embodiments of such a catheter antenna.

Figure 3B:
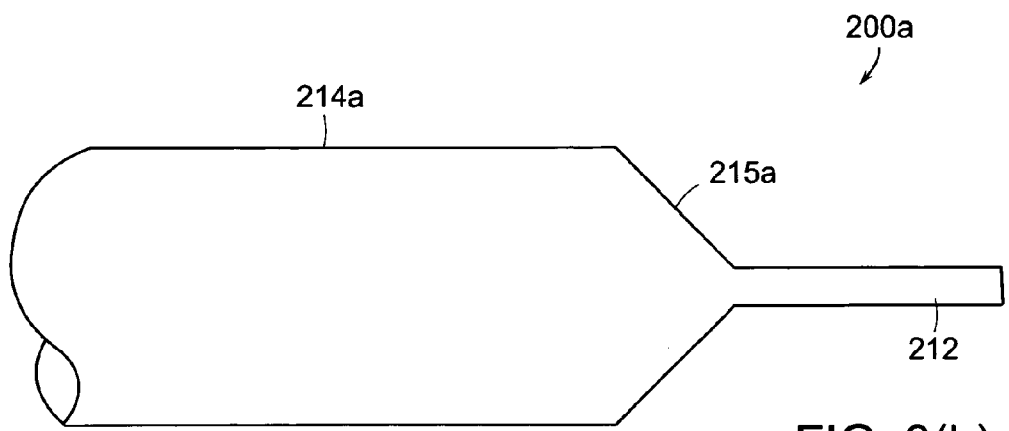
FIG. 3(b) is a partial view of the loopless antenna of FIG. 3(a) illustrating an embodiment thereof.
Figure 3C:
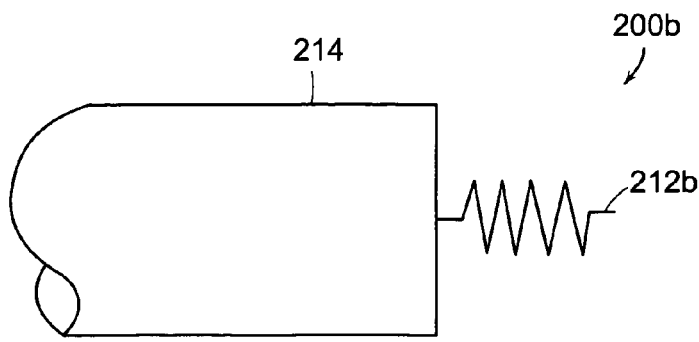
FIG. 3(c) is a partial view of the loopless antenna of FIG. 3(a) illustrating another embodiment thereof.
Figure 3A:
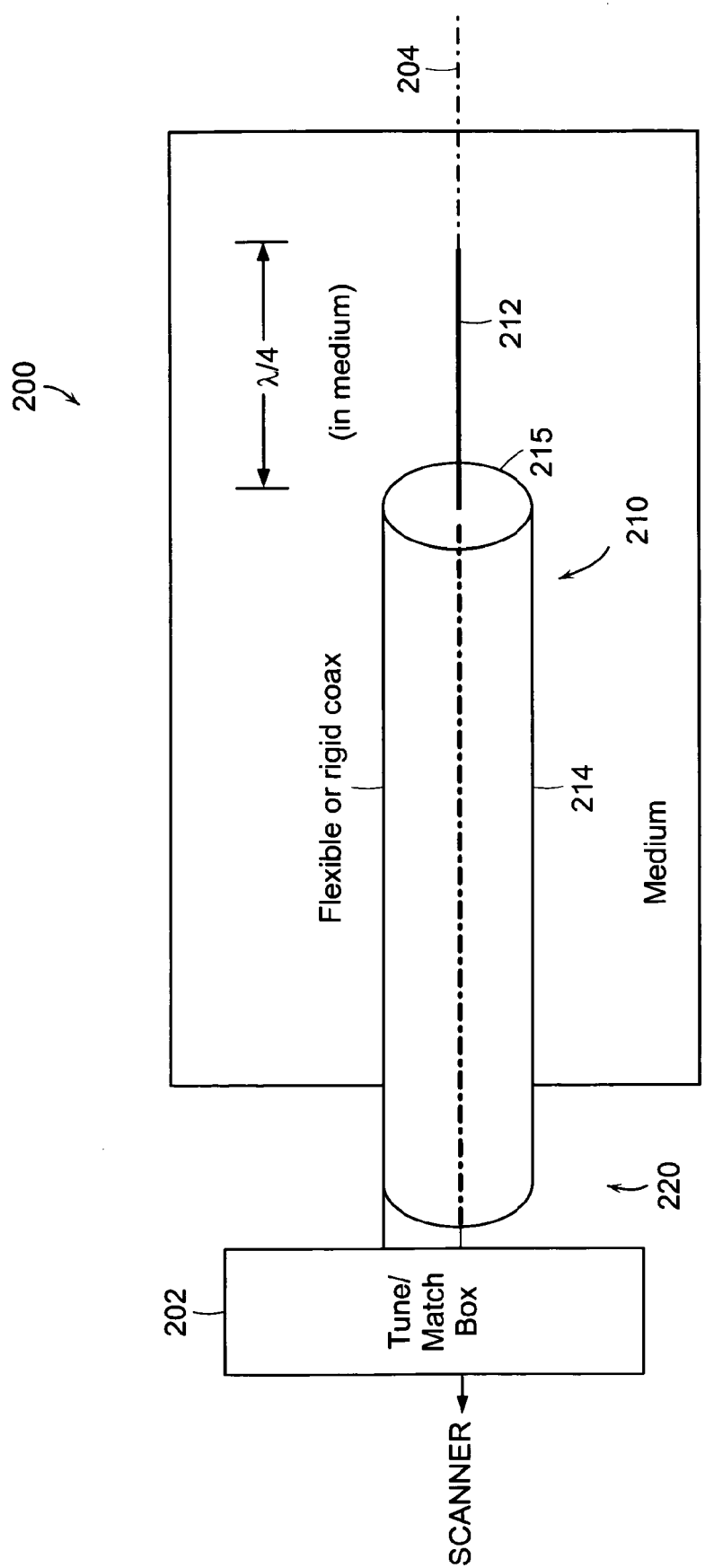
FIG. 3(a) is a schematic view that generally illustrates a loopless catheter antenna according to the present invention coupled to signal processing circuitry without an inherent slice localizing mechanism for clarity.

Referring now to FIG. 3(a), there is shown a schematic view that generally illustrates a loopless catheter antenna 200 (hereinafter loopless antenna or loopless antenna catheter) according to the present invention coupled to signal processing circuitry or scanner without a slice localizing mechanism for clarity. As shown and known to those skilled in the art, the loopless antenna 200 is coupled to tune and match circuitry 202 which in turn is coupled to the scanner or signal processing circuitry.

The loopless antenna 200 includes an antenna portion 210 and a signal coupling portion 220. The antenna portion 210 includes a first portion 212 and a second portions 214, where the first portion is coupled to and extends from an end of the second portion. In the illustrated embodiment, the loopless antenna including the antenna portion 210 and the signal coupling portion 220 is in the form of a coaxial cable as is known to those skilled in the art and generally is the form as shown and described in U.S. Pat. No. 6,031,375 the teachings of which are incorporated herein by reference. In the illustrated embodiment, the first portion 212 is the inner conductor of the coaxial cable.

As shown in FIG. 3(a), the first portion 212 projects along a long axis 204 extending from an end surface 215 of the second portion 214 so that the first portion is generally perpendicular to the end surface. Such an arrangement shall not be limiting as it is within the scope of the present invention for the first and second portions 212,214 to be configured and arranged so as to form different arrangements. As shown in FIG. 3(b) for example, the second portion 214a can be arranged so that the end surface 215a forms a sloping surface (i.e., at an angle with respect to the first portion 212 or long axis 204). In this way, the end surface 215a slopes upwardly from the intersection between the first and second portions 212,214 to the exterior surface of the coaxial cable of the second portion. In yet another embodiment, the first portion 212b extends along and about the long axis 204 so as to form a 2D or 3D structure. In the illustrated embodiment, the first portion 212b is configured so as to form a helical structure that extends along and about the long axis 204.

In further embodiments, the first portion 212, 212b extends outwardly from the second portion 214, 214a a predetermined length. In particular embodiments, the predetermined length is established so the length of the first portion 212, 212b is equal to or about equal to a fraction of the EM wavelength ($\lambda$) of responsive emissions from the nuclei of the tissue being imaged, in that tissue. In more particular embodiments, the predetermined length is set so as to substantially equal or be equal to $\lambda/4$ in the tissue (i.e., $L=\lambda/4$ or $L\approx\lambda/4$).

As described further herein, the loopless antenna 200 includes a slice localizing mechanism that is arranged with respect to the first and second portions so an area where signal is desired is defined with respect to in the antenna portion 212. In other words, the slice localizing mechanism inherently defines a slice in the specimen to be imaged with respect to the antenna portion 212 whereas in conventional MRI techniques, the slice is defined with respect to the coordinate FoR of the scanner. Thus, the slice localizing mechanism of the present invention defines the volume of the specimen to be imaged without the need for first determining the location of the antenna portion with respect to the coordinate system of the scanner. Consequently, the image data can be acquired faster as compared to conventional imaging techniques when using the loopless antenna 200 of the present invention. As the SNR for MRI increases with signal averaging time, the loopless antenna 200 of the present invention also has the beneficial effect of improving the SNR in part because the image data can be acquired more efficiently as compared when using conventional imaging techniques.

In use, the loopless antenna 200 is inserted into the specimen so that the slice as defined by the slice localizing mechanism is positioned closely adjacent to the region of interest. For example, if the region of interest is a blood vessel and the particular target of interests is plaque the loopless antenna 200 is positioned so that the defined slice is positioned closely adjacent to the plaque to be imaged.

It should be recognized that the loopless antenna 200 of the present invention including one or both of the antenna portion and the signal coupling portion 220 to be protectively covered by a thin layer of a insulating plastic or other dielectric material which will not interfere with the functioning of the system. It also should be recognized that any of a number of loopless antennae as are known to those skilled in the art, such as for example the loopless antenna described in U.S. Pat. No. 5,928,145; to be adapted with a slice localizing mechanism as taught herein so that the slice to be imaged is inherently defined with respect to such other loopless antennas.

Figure 4:
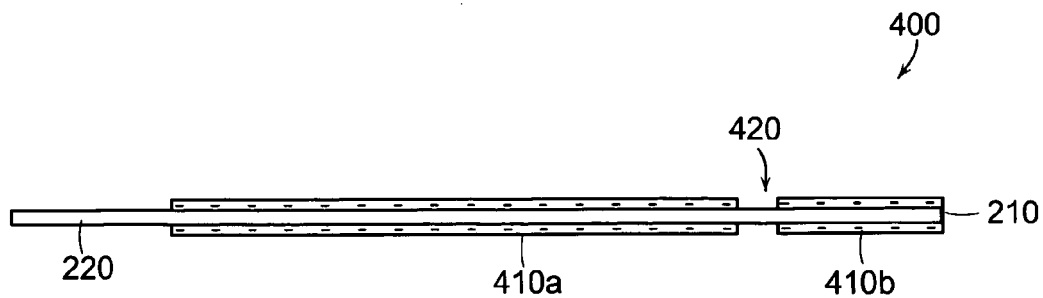
FIG. 4 is a schematic view of a loopless catheter antenna according to one embodiment of the present invention.

Referring now to FIG. 4, there is shown a schematic view of a loopless catheter antenna 400 according to one embodiment of the present invention that includes a slice localizing mechanism. Reference shall be made to the discussion above regarding FIG. 3(a) for details and features not described below. Also, while the following refers to the structure of the loopless antenna shown in FIG. 3(a), it is within the scope of the present invention for the alternative configurations shown in FIGS. 3(b) and 3(c) to include the slice localizing mechanism herein described.

In the illustrated embodiment the loopless antenna 400 includes one or more material coatings 410a,b that extend over a substantial length of loopless antenna (e.g., the antenna portion 210), which material is selected so as to have desired properties so as to achieve slice localization with respect to a given area 420 or location of the antenna portion from which signal is desired. Without being bound by any particular theory, the material coating 410a,b spoils or dephases the magnetization along and near the length of the loopless antenna 400 except for a region wherein the material coating is absent.

In particular embodiments, the material coating is formed from a strongly paramagnetic or ferromagnetic material along a substantial length of the probe except the area 420 where signal is desired. Such materials include but are not limited to Dysprosium Oxide, stainless steel powders (type AISI 410), nickel and copper-zinc-ferrite powders. Such a material coating 410a,b is formed of the material having the desired properties or a composition of the material having the desired properties suspended in another medium or binding substrate such as for example an adhesive or resin or paint or other substance known to those skilled which can be applied to the antenna portion 210.

The material coating 410 a,b is applied to the antenna portion so that the area 420 from which signal is desired is locatable at any of a number of positions. In more particular embodiments, the area 420 from which signal is desired is located in the range of from the tip of the first portion 212 to and including the intersection between the first and second portions 212,214. When the area 420 from which signal is desired is at the tip of the antenna 412, a material coating 410a would be applied to only the single section of the antenna portion that is adjacent to the area and which extends backwardly along the length of the antenna portion towards the signal coupling portion 220, and section 410b is omitted. In the case where the area 420 from which signal is desired is at a location away from the tip of the antenna 412, then a material coating at 410a and a material coating 410b would be applied to the sections adjacent to the area, where one section extends backwardly along the length of the antenna portion towards the signal coupling portion 220 and the other section extends forwardly along the length of the antenna portion to the tip. In this way, the sensitive region of the antenna portion, namely the area 420 where signal is desired, can be shifted possibly to many desired locations along the portion of the probe that is utilized for detecting MRI signals, by shifting the area 420 that is devoid of the material coating.

Figure 5:
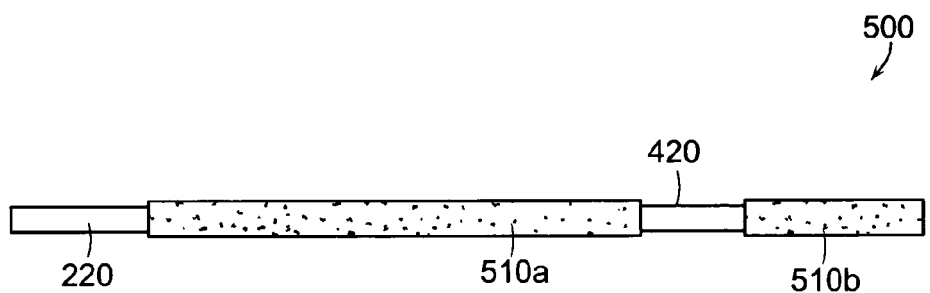
FIG. 5 is a schematic view of a loopless catheter antenna according to another embodiment of the present invention.

Referring now to FIG. 5, there is shown a schematic side view of a loopless catheter antenna 500 according to another embodiment of the present invention that includes a slice localizing mechanism. Reference shall be made to the discussion above regarding FIG. 3(a) for details and features not described below. Also, while the following refers to the structure of the loopless antenna shown in FIG. 3(a), it is within the scope of the present invention for the alternative configurations shown in FIGS. 3(b) and 3(c) to include the slice localizing mechanism herein described.

In the illustrated embodiment the loopless antenna 500 includes one or more permanent magnets 510 a,b that are arranged so as to extend over a substantial length of loopless antenna (e.g., the antenna portion 210), each of the one or more permanent magnets 510,b is selected so as to have desired properties to achieve slice localization with respect to a given area 420 or location of the antenna portion from which signal is desired. In illustrative embodiments, each of the one or more magnets 510 a,b are embedded in the exterior surface of the antenna portion and/or affixed to the exterior surface thereof using any of a number of techniques known to those skilled in the art (e.g., adhesives). Without being bound by any particular theory, the one or more magnets 510a,b spoil or dephase the magnetization along the length of the loopless antenna 400 except in the area where the magnet(s) is absent. In particular embodiments, the loopless antenna 500 includes a plurality of such permanent magnets 510a,b that are arranged about and/or along the length of the antenna portion.

Similar to the discussion above regarding FIG. 4, the one or more permanent magnets 510a,b are applied to and/or embedded in the antenna portion so that the area 420 from which signal is desired is locatable at any of a number of positions. In more particular embodiments, the area 420 from which signal is desired is located in the range of from the tip of the first portion 212 to and including the intersection between the first and second portions 212,214. When the area 420 from which signal is desired is at the tip of the first portion, one or more permanent magnets 510a would be applied to the section of the antenna portion that is adjacent to the area and which extends backwardly along the length of the antenna portion towards the signal coupling portion 220. In the case where the area 420 from which signal is desired is at a location away from the tip, then one or more permanent magnets 510a,b would be applied to each of the sections adjacent to the area, where one section extends backwardly along the length of the antenna portion towards the signal coupling portion 220 and the other section extends forwardly along the length of the antenna portion to the tip. In this way, the sensitive region of the antenna portion, namely the area 420 where signal is desired, can be shifted possibly to any desired location along the length of the probe by shifting the area 420 that is devoid of the permanent magnets.

Figure 6:
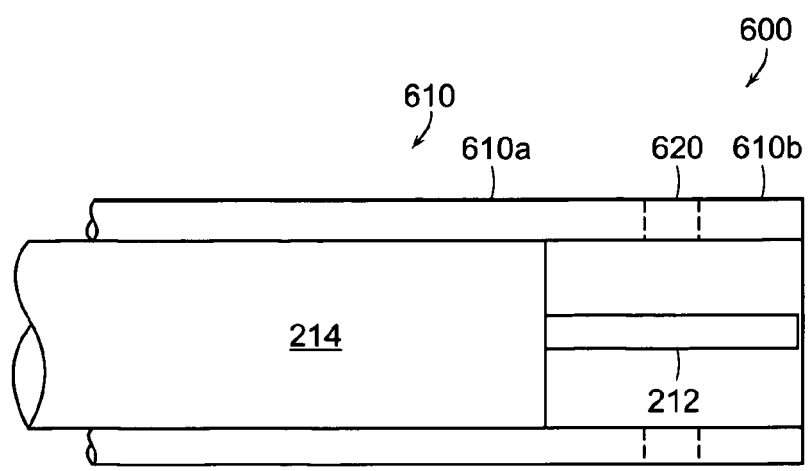
FIG. 6 is a schematic view of a loopless catheter antenna according to yet another embodiment of the present invention.

Referring now to FIG. 6, there is shown a schematic side view of a loopless catheter antenna 600 according to another embodiment of the present invention that includes a slice localizing mechanism. Reference shall be made to the discussion above regarding FIG. 3(a) for details and features not described below. Also, while the following refers to the structure of the loopless antenna shown in FIG. 3(a), it is within the scope of the present invention for the alternative configurations shown in FIGS. 3(b) and 3(c) to include the slice localizing mechanism herein described.

In the illustrated embodiment the loopless antenna 500 includes a sleeve member 610 configured so as to extend along and about the exterior surface of the antenna portion. The sleeve member 610 also is arranged so that it is retained to the exterior surface and not movable thereon when the loopless antenna 500 is inserted into the specimen (e.g., blood vessel) for imaging. While shown as being a generally cylindrical in structure this is not a limitation as the sleeve member 610 can present any of a number of configurations including one that complements the configuration of the first and second portions 212, 214 of the antenna portion 210.

In this embodiment, the sleeve member 610 also is configured so as to include the material having good electrical conductivity, such as with copper, silver, gold, platinum or aluminum, or coatings of such conducting material presented in a biocompatible substrate such as a polymer known to those skilled in the art. The sleeve member is electrically insulated from the outer conductor of antenna 220 by means of a dielectric material, and effectively forms, and/or may be formed from a section of tri-axial cable over the portion of the antenna that would otherwise be utilized for detecting MR signals.

The sleeve member 610 is arranged with a gap in the electrically conducting portion of the material so as to define an area 620 therein from which signal is desired by means of spoiling or limiting the RF magnetic field at the MRI frequency. For example, the electrically conducting material used to form the sleeve member is a material coating applied to a dielectric layer covering antenna portion 220 except in the area 620 where signal is desired. In a further embodiment, the sleeve member 610 is configured such that its extent along and about the exterior surface of the antenna portion is substantially equal to the EM wavelength of λ/4 when configured with the antenna and located in the sample. Although the sleeve member is illustrated in conjunction with a loopless antenna, it will be understood by those skilled in the art that the member can also be used in conjunction with other RF probe designs including for example those illustrated in FIGS. 9 and 10.

Similar to the discussion above regarding FIGS. 4-5, the gap in the electrically conducting region in the sleeve member may be configured in such a fashion that the area 620 from which signal is desired is locatable at any of a number of positions. In more particular embodiments, the area 620 from which signal is desired is located in the range of from the tip of the antenna portion 212 to and including the intersection between the first and second portions 212, 214. When the area 620 from which signal is desired is at or near the tip of antenna portion 212, the section 610a of the sleeve member spoiling or limiting the RF magnetic field is adjacent to the area 620 and extends backwardly along the length of the antenna portion towards the signal coupling portion 220, and portion 610b is omitted. In other embodiments in which portion 610b is omitted, portion 610a may take the form of a 'sleeve balun' or 'quarter-wave choke' or 'bazooka balun' as known in the antenna literature. In the case where the area 620 from which signal is desired is at a location away from the tip, up to two sleeve sections 610a,b are provided to spoil the RF magnetic field, where one section 610a extends backwardly along the length of the antenna portion towards the signal coupling portion 220 and the other section 610b extends forwardly along the length of the antenna portion to the tip. In this way, the sensitive region of the antenna portion, namely the area 620 where signal is desired, can be shifted possibly to any desired location along the length of the probe by shifting the area 620 that is devoid of conducting material that spoils the RF magnetic field.

Referring now to FIG. 7(a), there is shown a schematic side view of a loopless catheter antenna 700 according to another embodiment of the present invention that includes a slice localizing mechanism and an illustrative view of the variation of the net magnetic field amplitude ($B_0$) as a function of distance along such a loopless catheter antenna afforded by the slice localizing mechanism. Reference shall be made to the discussion above regarding FIG. 3(a) for details and features not described below. Also, while the following refers to the structure of the loopless antenna shown in FIG. 3(a), it is within the scope of the present invention for the alternative configurations shown in FIGS. 3(b) and 3(c) to include the slice localizing mechanism herein described.

In the illustrated embodiment, a separate wire 702 is introduced and coiled along the length of the MR antenna portion 210 except the region 720 where signal is desired. The wire 702 is more particularly coiled to create two windings 704 a,b that are interconnected by an interconnecting wire 706. The windings 704a,b cooperate so as to create a spoiling gradient magnetic field 720 as illustrated in FIGS. 7(a),(b). In application, a low frequency current (DC-200 kHz, as in a frequency range known for use in supplying imaging gradient magnetic fields for MRI) is passed through the wire 702 during RF transmission in order to spoil the local magnetic field so that there will be no signal contribution except from the region 720 where signal is desired. If the loopless antenna 700 shown in FIG. 7(a) 4 is used as a receiver and is not receptive to signals beyond its physical length, the MR signal is localized to a slice about point z1 as shown in FIG. 7(b).

Similar to the discussion above regarding FIGS. 4-6, the wire can be wound so the windings 704 a,b are arranged in such a fashion that the area 720 from which signal is desired is locatable at any of a number of positions. In more particular embodiments, the area 720 from which signal is desired is located in the range of from the tip of the antenna 212 to and including the intersection between the first and second portions 212,214. When the area 720 from which signal is desired is at the tip of the antenna, one winding 704a is provided adjacent to the area 720 and extends backwardly along the length of the antenna portion towards the signal coupling portion 220, and the second winding 704b is omitted. In the case where the area 720 from which signal is desired is at a location away from the tip, then two windings 704a, 704b are provided to spoil the local magnetic field, where one winding 710a extends backwardly along the length of the antenna portion towards the signal coupling portion 220 and the other section 710b extends forwardly along the length of the antenna portion to the tip. In this way, the sensitive region of the antenna portion, namely the area 720 where signal is desired, can be shifted possibly to any desired location along the length of the antenna portion that is normally utilized for detecting MR signals. by shifting the area 720 that is devoid of windings.

Referring now to FIG. 8(a), there is shown a schematic side view of a loopless catheter antenna 800 according to another embodiment of the present invention that includes a slice localizing mechanism and an illustrative view of the variation of the magnetic field as a function of distance along such a loopless catheter antenna is shown in FIG. 8(b). Reference shall be made to the discussion above regarding FIG. 3(a) for details and features not described below. Also, while the following refers to the structure of the loopless antenna shown in FIG. 3(a), it is within the scope of the present invention for the alternative configurations of the loopless antenna shown in FIGS. 3(b) and 3(c) to include the slice localizing mechanism herein described.

In the illustrated embodiment, a separate wire 802 is coiled along the length of the loopless antenna portion 210 including regions 820 where signal is desired. The wire 802 is more particularly coiled to create two windings 804 a,b (e.g., opposed solenoids) that are interconnected by an interconnecting wire 806. The two windings 704a,b cooperate as to create or provide a substantially linear magnetic field gradient along the axis of the winding over the region of the antenna that is sensitive to the detection of MRI signals as illustrated in FIGS. 8(a),(b). In application, the windings are excited with a low frequency current (DC-200 kHz, as in a frequency range known for use in supplying gradient magnetic fields in the field of MRI), which enables slice selection inherently defined or locked to the FoR of the loopless antenna 800 MRI probe. As shown in FIG. 8(b), a slice at, for example, z2, may be selected by tuning the excitation pulse to the MRI frequency at z2, whereby the slice is localized to the antenna 800 as it moves within the scanner. It will be understood by those skilled in the art of MRI, that slices at other locations z2 within the region of the antenna that is sensitive to the detection of MRI signals may be selected by adjusting the frequency of MRI excitation as in conventional slice selection strategies. When using such a loopless antenna 800 in a preferred embodiment, the antenna 210 is used as the antenna as a RF transmitter for exciting the MR signals.

Similar to the discussion above regarding FIGS. 4-6, the wire can be wound so the windings 804 a,b are arranged in such a fashion that the area 720 from which signal is desired is locatable at any of a number of positions. In more particular embodiments, the area 820 from which signal is desired is located in the range of from near the tip of the antenna 212 to and including the intersection between the first and second portions 212,214. In this case, two windings 804a,b are provided to produce a gradient magnetic field, where one winding 804a extends backwardly along the length of the antenna portion towards the signal coupling portion 220 and the other winding 804b extends forwardly along the length of the antenna portion to the tip. In this way, and by means of adjustment of the frequency of the MRI excitation pulse, the sensitive region of the antenna portion, namely the area where signal is desired, can be shifted possibly to any desired location along the length of the antenna portion.

In yet further embodiments, the gradient provided by the windings 804a,b as shown in FIG. 8(a) also is used as a read-out gradient along the axis of the loopless antenna 210. The FT of the received read-out signal is proportional to a projection of the MRI signal distribution along the axis of the probe.

Figure 9A:
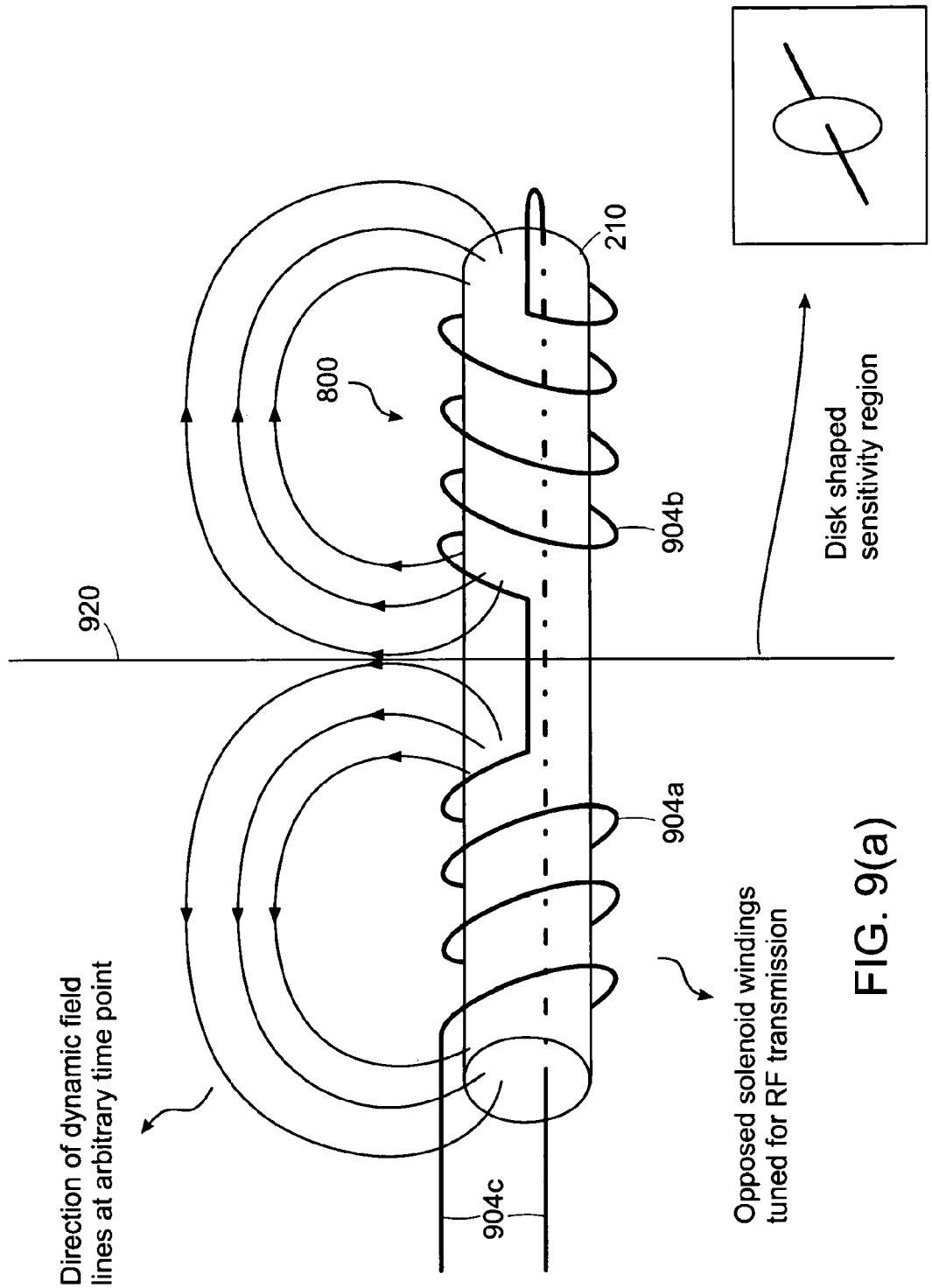
FIG. 9(a) is a schematic view of the loopless catheter antenna of FIG. 8(a) illustrating the field distribution when the windings are used for RF transmission.
Figure 9B:
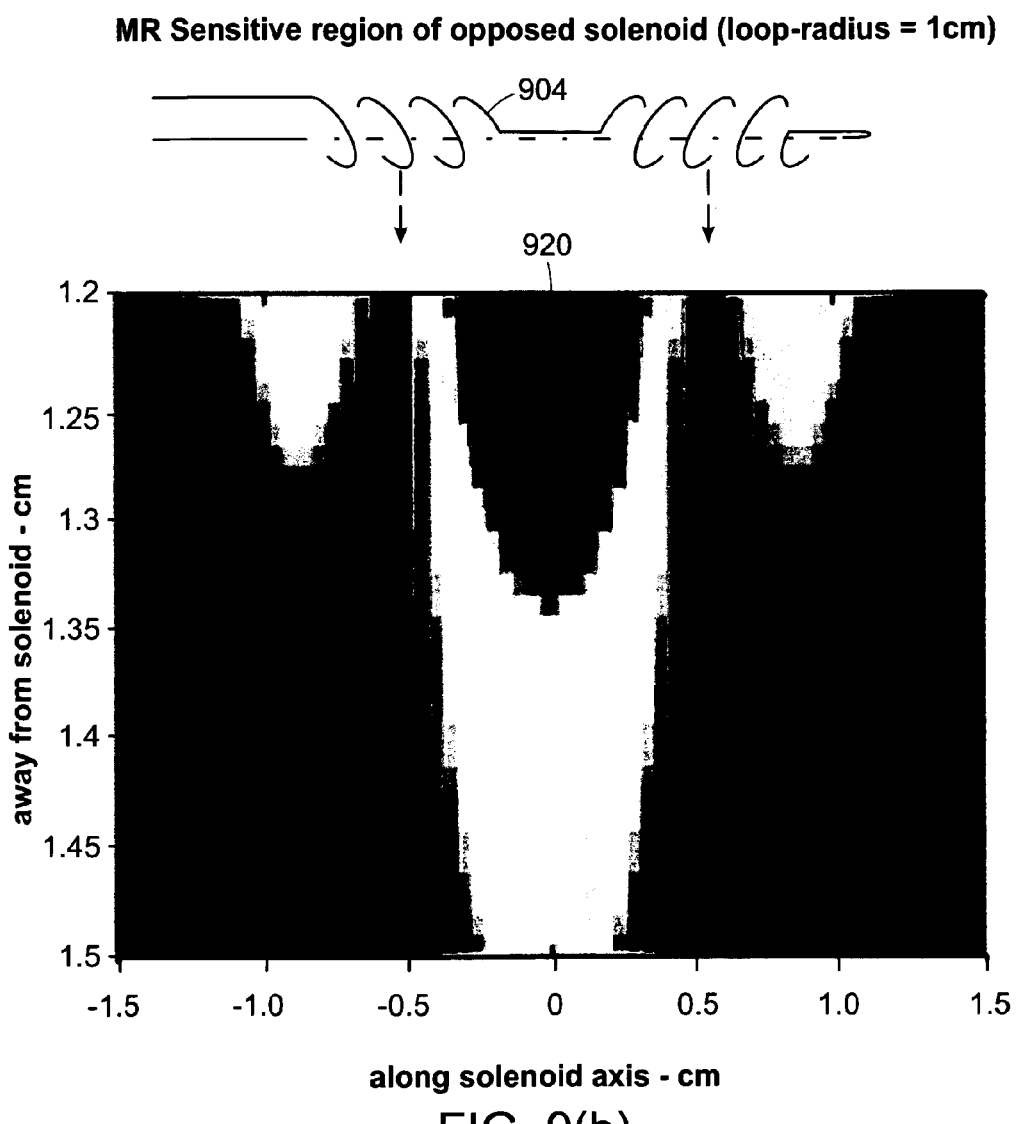
FIG. 9(b) is an illustrative view of a simulated sensitivity profile for the loopless catheter antenna of FIG. 9(a) when the windings are used for RF transmission.

In an alternative embodiment and with reference to FIG. 9(a), the added windings 904 are tuned to an MR frequency of the sample and used for RF transmission, instead of carrying low frequency current as described in the embodiments above. In this embodiment, the windings 904a and 904b are tuned to the MR frequency and are used for MR excitation, instead of using the loopless antenna for MR excitation. The RF current in the windings, FIG. 9(a), excites a slice that is perpendicular to the probe. The loopless antenna is retained but only used for the detection of desired signals. In further embodiments, a reactive element (e.g., an inductor or preferably a capacitor) may be coupled between the winding leads 904c, for example at the proximal end, for purposes of tuning the coil 1004 to resonate at the desired frequency.

In a further embodiment relating to this figuration with reference to FIGS. 9(a),(b), the windings 904a,b on the antenna portion 210 that are used for MR excitation, are also used to receive MR signals, and the loopless antenna conducting portions of antenna 220 are omitted entirely, leaving just the shaft 210 as a support for the RF windings. The sensitivity profile of the design localizes the signal to an approximately disk-shaped region 920 around the antenna portion as cartooned in the inset of FIG. 9(a) and in the computed sensitivity profile shown in FIG. 9(b) with the coil location at top. In the illustrated embodiment, the 'sensitive disk' is locked to and defined with respect to the antenna portion 210 as the antenna portion moves in the scanner.

Figure 10A:
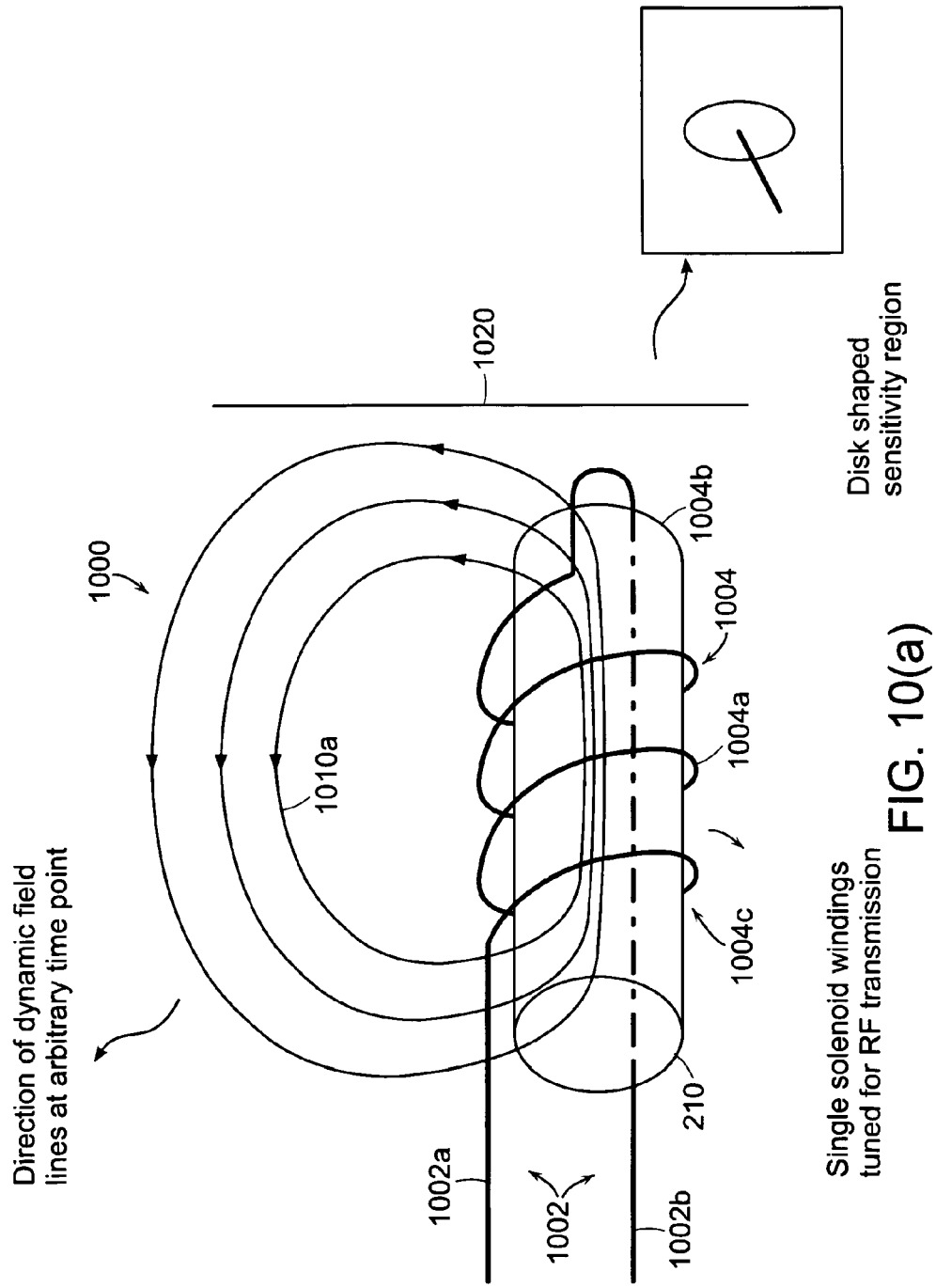
FIG. 10(a) is a schematic view of a loopless catheter antenna according to another embodiment of the present invention and illustrating the field distribution when there is a single winding.
Figure 10B:
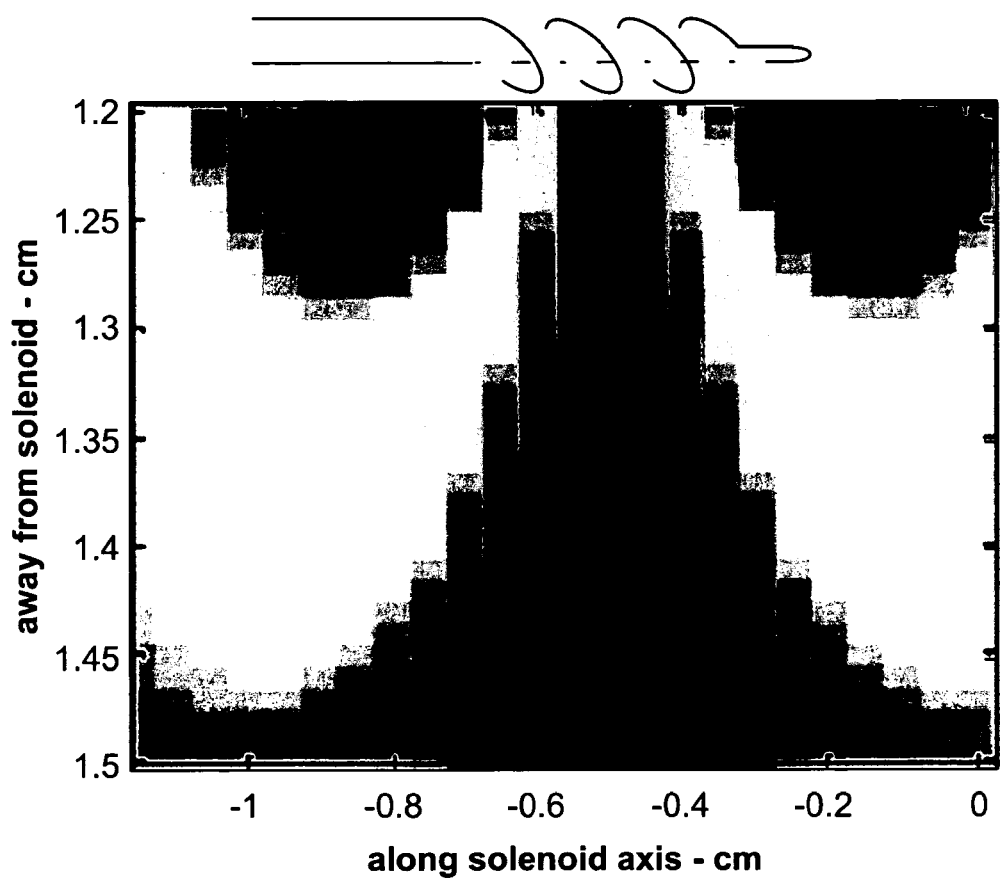
FIG. 10(b) is an illustrative view of a simulated sensitivity profile for the loopless catheter antenna of FIG. 10(a).

In yet another alternative embodiment and with reference to FIGS. 10(a),(b), the embodiment of FIG. 9 that omits the loopless antenna, employs an RF antenna 1000 tuned to the MR frequency and configured so that the wire 1002 is coiled to form one or more loop turns 1004, instead of the opposed solenoids shown in FIG. 9(a). The windings 1004 are used for both excitation and detection, so that the loopless antenna conducting portions are omitted except for a shaft that physically supports the windings. In further embodiments, a reactive element (e.g., an inductor or preferably a capacitor) may be coupled between the winding leads 1002a,b for purposes of tuning the coil 1004 to resonate at the desired frequency. With the shaft substantially parallel to $B_0$, this configuration results in two regions of MR sensitivity or 'sensitive disks' which fall at each end of the windings, 1004b and 1004c. The construction is shown in FIG. 10(a), and an EM field analysis showing the two regions and 'sensitive disks' is shown in FIG. 10(b). In the preferred embodiment of this design, one of the sensitive disk lobes of FIG. 10(b), preferably the one on the proximal side of the probe, 1004c, is suppressed to avoid aliasing by means of the addition of coatings or embedding magnets to spoil the local magnetic field, as described hereinabove.

This configuration also affords sensitivity when the shaft's orientation 210 is skewed or even perpendicular to $B_0$. In such orientations, the axial component of the B1 field will have a component orthogonal to $B_0$ which is sensitive to MRI, whereupon the coil can be used for both excitation and detection. In particular, when the shaft axis 210 is perpendicular to $B_0$, the B1 field at the center 1004a of the coil is entirely orthogonal to $B_0$, and there is a single plane of maximum sensitivity instead of two. The resulting single sensitive disk passes through the coil center at 1004a instead of sensitivity disks at each end of the coil 1004b, 1004c. Additional coatings or spoiling magnets are therefore no longer required to limit sensitivity to a single sensitive disk. However it will be understood from the B1 field profile of the loop-antenna embodiment of FIG. 10a, that a skewed orientation relative to B0 can in general result in MR sensitivity at the two ends of the windings 1004b,c, in addition to the center 1004a, broadening the sensitivity. To minimize the broadening of the sensitive disk in off-axis or skewed orientations, it is desirable to minimize the length of the loop coil (between 1004b and 1004c) so that the sensitive disks at 1004a,b and c are adjacent, overlap, and merge to in essence form a single sensitive region or disk.

Figure 11:
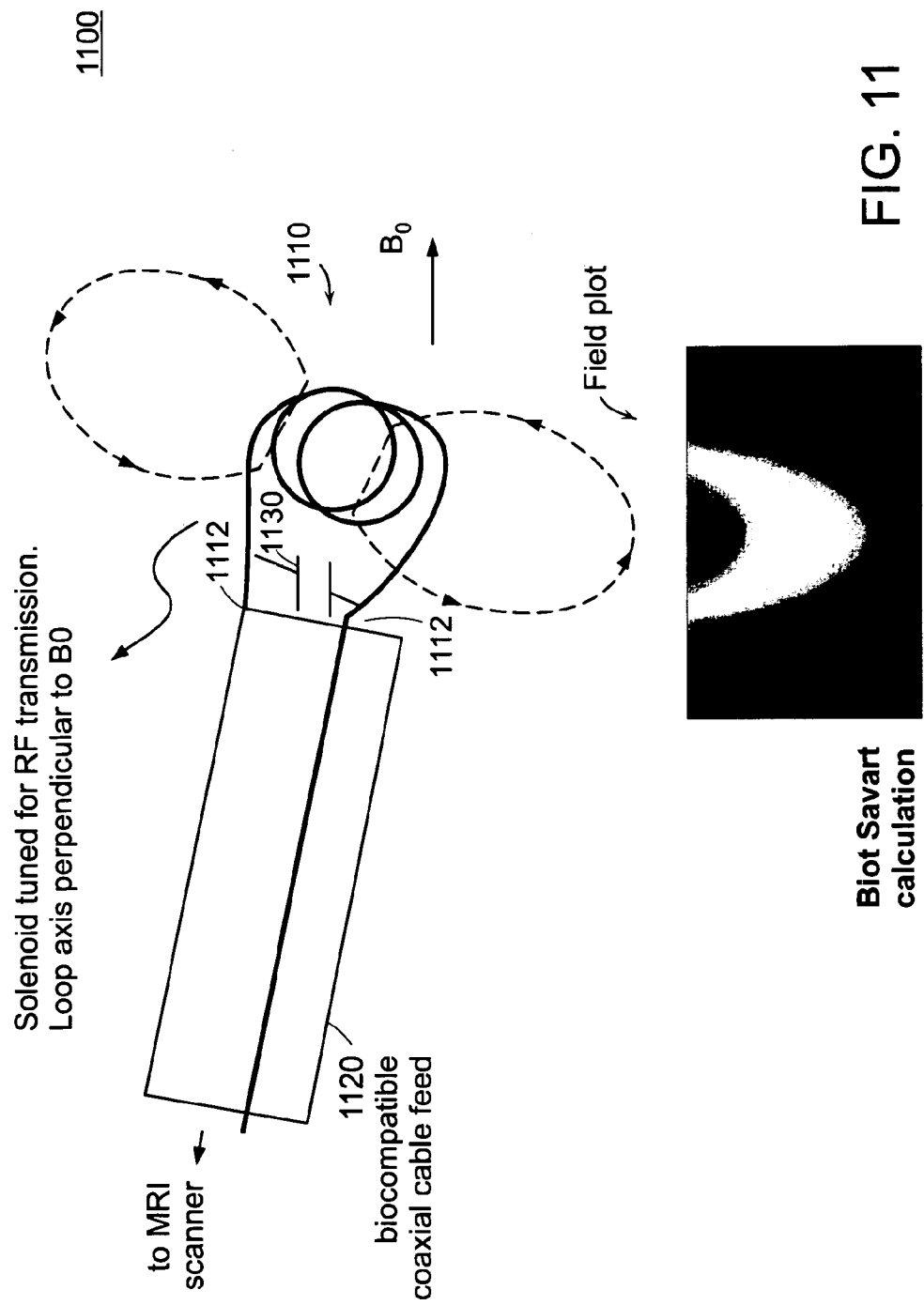
FIG. 11 is an illustrative view of an endoscopic antenna 1100 according to another aspect of the present invention.

Referring now to FIG. 11 there is shown yet another endoscopic antenna 1100 of the present invention. This endoscopic antenna 1100 is comprised of an MRI coil 1110 including one or more loops analogous to that in FIG. 10(a) except that the coil axis is perpendicular to the long axis of the endoscope. It also is within the scope of the present invention for the coil axis to be arranged to be parallel to the long axis of the endoscope. The coil 1110 is tuned to resonate at the MRI frequency, and the 2 ends 1112 of the coil are fed to the scanner via a cable 1120. In further embodiments, a reactive element 1130 (e.g., an inductor or preferably a capacitor) is used for purposes of tuning the coil 1110 to resonate at the desired frequency. In further embodiments where it is desirable to switch between endoscopic MRI and conventional MRI, a switching element is connected across the reactive tuning element to short out the tuning element and thereby deactivate the device during conventional MRI.

In particularly illustrative embodiments, the cable 1120 is a biocompatible cable formed with super-elastic nonmagnetic materials such as nitinol or non-magnetic stainless steel. In further embodiments the cable is a coaxial cable whose shield and core conductors are formed of superelastic materials separated by an insulating dielectric such as a polymer. In further embodiments, the electric properties of the biocompatible cable are improved by plating with any of a number of materials such as gold, platinum, and silver. In further embodiments, a matching circuit (not shown) as is known to those skilled in the art, is provided for matching the coil and the receiving circuitry. In further embodiments that enable switching between endoscopic MRI and conventional MRI, a switching element is connected across the matching circuitry to deactivate the device during conventional MRI.

In yet further embodiments, methods of the present invention include use of adiabatic pulses that are adapted for use with the loopless antennas 200-400 described above in connection with FIGS. 3-8 and the looped antennae of FIGS. 9-11. In particular embodiments, the parameters of the adiabatic pulses are adjusted or set to effect improved slice profiles and excitation fields so as to provide desirable widths and shape of the region of desired signal.

Figure 12A:
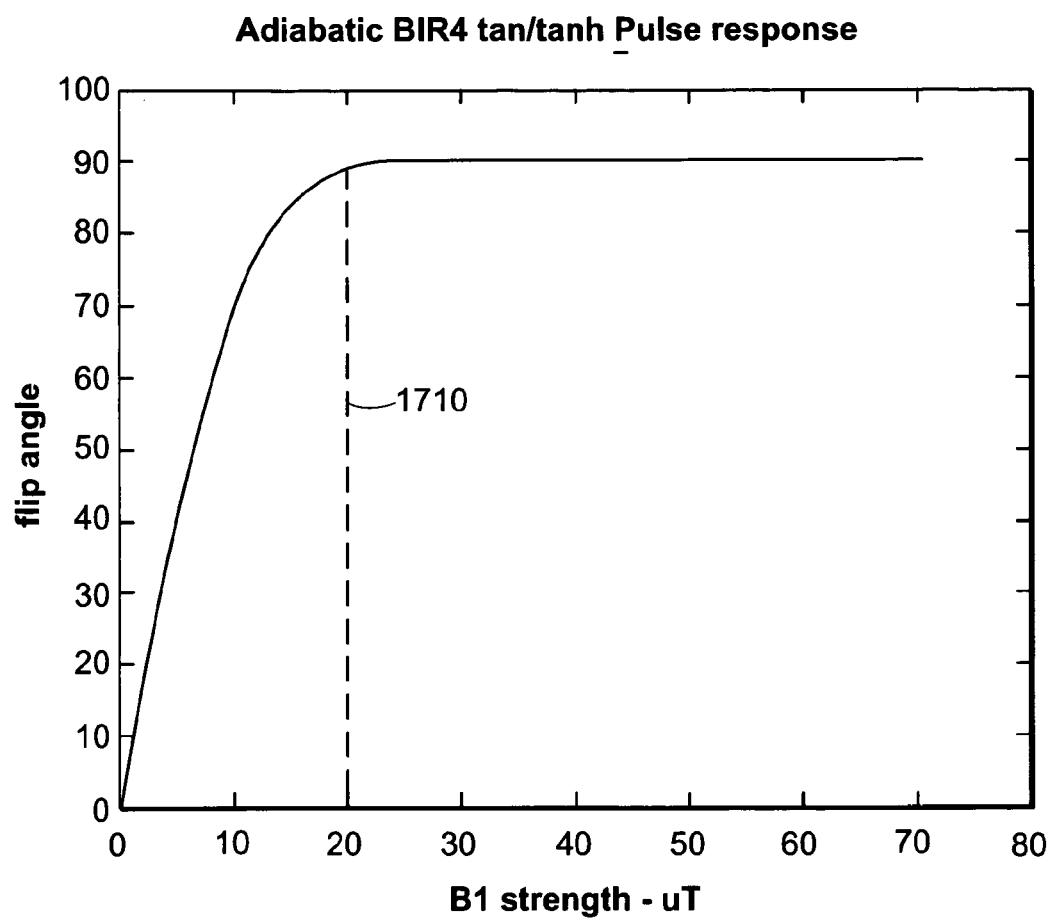
FIG. 12(a) is a graphical view of an adiabatic MR pulse flip-angle response as a function of B1 field strength.

Referring now to FIG. 12(a) there is shown a response of a particular adiabatic pulse: the BIR4 tan/tan h pulse such as that described by Garwood et al in J Magn Reson 1991; Vol 94: p 511, or as modified by Bottomley et al in J Magn Reson 1993; Vol 103A: pp 242-244. The flip angle produced by the pulse is set at some desired value, and is maintained constant (e.g., 90°) independent of the RF magnetic field strength (B1) above a threshold B1, 1210, by virtue of the "adiabatic" properties of these pulses. The value of the threshold can be varied by adjusting the pulse parameters (e.g., amplitude, sweep-width, pulse duration), and in the illustration, the threshold B1 has been set at approximately 20 uT.

Figure 12B:
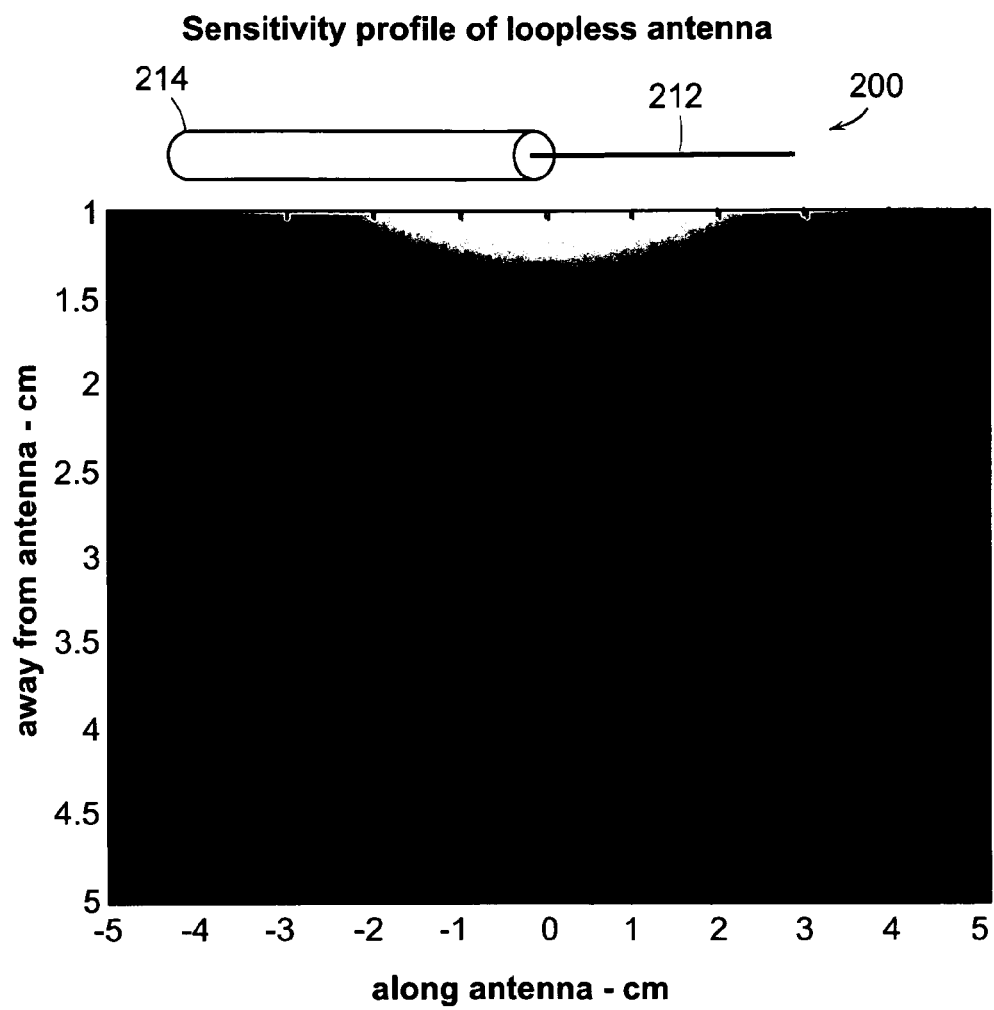
FIG. 12(b) is a simulated sensitivity profile of a conventional loopless catheter antenna is used for both excitation and detection with an adiabatic excitation pulse.

The adiabatic pulse is transmitted by the loopless antenna 200, or the loop antennae 904a, 904b, 1004, 1110 whose field is nonuniform. The sensitivity profile of the loopless antenna 200 is shown in FIG. 12(b). The figure is scaled to a maximum of 1 (arbitrary units). The loopless antenna 200 is most sensitive at the junction of the first and second portions—the cable 214, and the whip 212, decreasing with distance from the junction along the axis, as well as radially away from the loopless antenna.

Figure 12C:
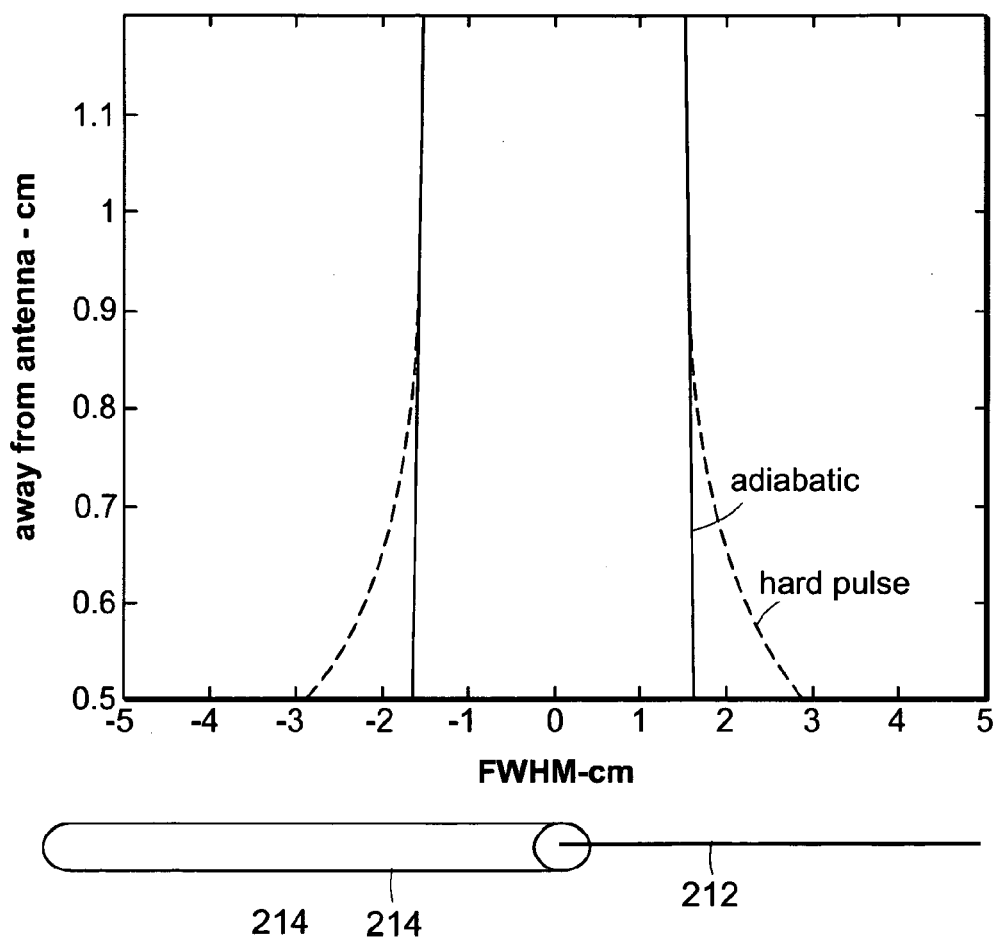
FIG. 12(c) is a graphical view showing improvement of slice profile with an adiabatic pulse.

FIG. 12(c) shows the improvement in slice profile when an adiabatic pulse is used for transmission and the loopless antenna 200 is used for RF transmission and signal reception. The figure is a plot of the fwhm signal at varying distances from the loopless antenna. The fwhm at a particular radial distance is defined as the width of the slice-profile within which half of the signal is received. It provides a measure of slice localization along the axis of the loopless antenna. For adiabatic RF transmission, the signal is localized to a central region about the junction of the first and second portions 212,214 (e.g., −1.5 to +1.5 cm on x-axis) for all distances away from the loopless antenna plotted on the y-axis. However, for block or square pulse transmission from the antenna, there is greater signal contribution from regions further away from the junction (e.g., −3 to 3 cm) for points radially close to the loopless antenna which exhibit the highest MR sensitivity. Moreover, dark rings associated with variations in B1 at locations that experience an integral multiple of 180° pulses within the region of desired signal when the loopless antenna is used for excitation, are substantially eliminated by use of such adiabatic pulses as will be seen and demonstrated with reference to FIGS. 17-19 hereinbelow.

In further embodiments, the use of an adiabatic pulse as described above is coupled with a 180° plane rotation pulse with a balanced crusher gradient magnetic field provided before and after the 180° pulse (as taught in Bottomley P A, Edelstein W A "Method of eliminating spurious FID due to imperfect 180° pulses in NMR imaging: the primer/crusher sequence"; U.S. Pat. No. 4,484,138; the teachings of which are incorporated herein by reference) to further narrow and hence improve the shape and thickness of the slice selected.

Referring now to FIGS. 13(a)-(d), there is shown various figures illustrating some preferred MRI pulse sequences that can be used for endoscopic MRI in accordance with the present invention. For the purpose of illustration, the device is oriented with long axis parallel to the direction of the main applied field B0, directed along the z-axis of a (x,y,z) Cartesian coordinate system, as is the convention. The MRI gradients referred to are in B0 with Gx=∂B0/∂x, Gy=∂B0/∂y, and Gz=∂B0/∂z, consistent with the convention known to those skilled in the MRI arts.

Referring now to FIG. 13(a) there is shown a "gradient echo" MRI sequence. MRI is excited by RF pulses applied by the endoscopic device, these preferably being "adiabatic" MRI pulses such as the adiabatic BIR-4 pulses which can have a prescribed flip-angle, a BIRP pulses which have the same form but the phase jumps that are provided in the pulse to set the flip-angle are phase-cycled in consecutive applications (see: Garwood, J Magn Reson 1991; 94: p 511, Bottomley, J Magn Reson 1993; 103A: 242). Alternatively the RF pulse can be an adiabatic half passage pulse (AHP). In general the adiabatic pulses are both amplitude and frequency modulated. The localizing effects of the endoscopic device/probe design and excitation will limit sensitivity to a small approximately disk-shaped volume perpendicular to the Z-axis, as described with reference to FIGS. 12, 17 and 19 hereinbelow.

After the RF pulse is applied with the endoscopic probe, the MRI system gradients are applied to spatially encode the signals in the remaining 2 dimensions of the discoidal excited volume. In particular, a phase-encoding gradient is applied with a particular amplitude for a short period in a first dimension in the excited volume. This is depicted as Gy. At the same time a reversed gradient lobe is applied in the $2^{nd}$ dimension, depicted here as Gx, followed by a constant "read-out" gradient during which time the phase-encoding gradient is switched off, and the MRI signals are acquired. For example, Nx data points may be acquired during the "receive" period. The sequence is repeated with Ny different phase-encoding gradient amplitudes in steps. The 2D Fourier Transform (FT) of the MRI signals yields a cross-sectional endoscopic image of the sensitive disk. Repeat signals can be acquired with the same gradients for averaging to improve SNR as known to those skilled in the arts.

Referring now to FIG. 13(b) there is shown a "projection reconstruction" MRI sequence. Excitation is the same as for FIG. 13(a), but the phase-encoding gradient (Gy) is replaced by gradient whose wave-form is of the form of the Gx gradient in FIG. 13(a). The 2 Cartesian gradients applied together form a single radial gradient across the excited disc-shaped volume. The FT of the signal acquired during the flat portion of the gradient is a projection of the MRI signal in the disk in the direction of the radial gradient. The radial gradient is rotated in the disk during repeat excitations by increasing and decreasing the two gradient amplitudes in steps, and a complete set of projections is so generated. An image of the sensitive volume is then reconstructed from the projections, using standard reconstruction methods known in MRI and computer assisted tomography (CAT).

Referring now to FIG. 13(c) there is shown a "steady-state driven free precession" (SSFP) MRI pulse sequence, as will be appreciated by those skilled in the art. The sequence and reconstruction are essentially the same as for FIG. 13(a), except that at the end of the acquisition period the gradients are reversed, and wherein the reversed gradient amplitudes are adjusted so that the net accumulation of gradient-induced phase variations across the excited volume is zero between the excitation pulses. Because there is little phase loss, this sequence produces higher SNR, but is more artifact-prone (motion, B0 inhomogeneity, etc), and does lose some signal due to the reduction in the acquisition window for the time taken to reverse the gradients. FIG. 13(b) can be similarly converted to a SSFP sequence by reversing the 2 projection gradients at the end of the interval.

Referring now to FIG. 13(d) there is shown a "spiral" MRI pulse sequence in which excitation proceeds as described for FIGS. 13(a)-(c). In this case however, instead of a projection gradient being applied as in FIG. 13(b), the 2 directions in the sensitive disk of the selected volume are spatially encoded using a time varying gradient that traverses the spatial "k-space" of the sample. These gradients can be balanced as described for FIG. 13(c) by reversing the gradients to reverse the accumulated signal dephasing, so as to generate an SSFP signal.

While the above description refers to a device in the z-direction with spatial-encoding gradients in the x- and y directions, as is known to those skilled in the art, it is straight-forward to rotate the plane that is being spatially encoded in all 3 directions so as to be substantially orthogonal to the direction of the wire and coplanar with the excited discoidal volume. This is done by adding appropriate components of Gx, Gy and Gz proportionate to the direction cosines of the plane relative to the laboratory FoR. It is recognized however, that the orientation of the plane in the laboratory FoR may not be known for an operator using the endoscopic FoR. Therefore, it is contemplated and thus within the scope of the present invention to provide a capability of rotating the plane for example under joy-stick control of the scanner, by allowing for real-time adjustment of the gradient direction cosines.

Figure 14:
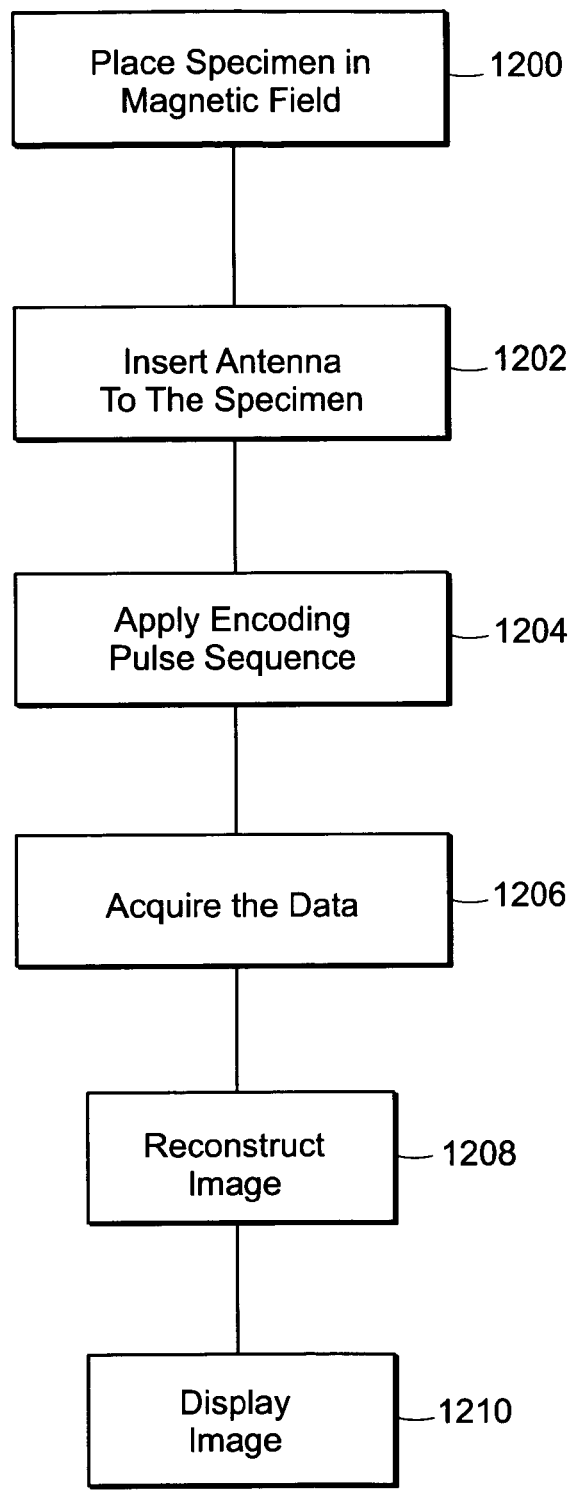
FIG. 14 is a flow diagram generally illustrating an imaging method of the present invention.

Referring now to FIG. 14, there is shown a flow chart illustrating the methodology of the present invention. The flow chart herein illustrates the structure of the logic of the present invention as embodied in computer program software for execution on a computer, digital processor or microprocessor. Those skilled in the art will appreciate that the flow chart illustrates the structures of the computer program code elements, including logic circuits on an integrated circuit, that function according to the present invention. As such, the present invention is practiced in its essential embodiment(s) by a machine component that renders the program code elements in a form that instructs a digital processing apparatus (e.g., computer) to perform a sequence of function step(s) corresponding to those shown in the flow diagrams.

According to the method of the present invention, the specimen is placed within the magnetic field generated by the magnet, Step 1200. The antenna 200 or loopless antenna catheter is inserted into the specimen (e.g., target blood vessel) in Step 1202, including manipulating and moving the loopless antenna 200 so as to be at the desired position or location. As described herein, alternatively, the loopless antenna 200 can be operated so as to image as the antenna is moved from location to location without requiring a sequence of steps be performed to locate the antenna and thus determine the location of the slice with respect to the scanner FoR. When imaging is desired, one or more encoding pulse sequence(s) is applied, in Step 1204 using a conventional RF coil and/or the loopless antenna for RF signal transmission.

The image data is acquired by the computer 120 in Step 1206 using the loopless antenna. As the loopless antenna is configured to control slice localization, the slice from which the image data is acquired is inherently defined by the structure and configuration of the loopless antenna, as detailed in the embodiments above. The acquired data is processed in the computer employing for example, FT image reconstruction, Step 1208. The particular methodology used to reconstruct the image is based on the particular imaging technique used to acquire the image data.

In this regard, the methodology of the present invention contemplates use of the foregoing described loopless antenna embodiments 200-1000 as well as the use of adiabatic pulses, alone or in combination for controlling selection and localization of a slice. It also is contemplated and thus within the scope of the present invention that in addition to providing the foregoing described loopless and loop antennae 200-1100 as well as the use of adiabatic pulses, alone or in combination, the methodology of the present invention be adapted so as to also embody any of a number of encoding techniques known to those skilled in the art, including (i) azimuthal and radial encoding as in the cylindrical encoding approach described in U.S. Pat. No. 6,031,375 (the teachings of which are incorporated herein by reference) or (ii) read-out and phase encode encodes as in conventional 2D FFT MRI to provide images of a desired region of interest (ROI) around the loopless antenna.

As indicated above, the methodologies of the present invention can embody conventional MRI which is locked to the laboratory FoR, to achieve spatial encoding of the endoscopic image plane which is locked to the FoR of the MRI probe, by a rapid "reference frame shifting" procedure which can be performed automatically. Because the conventional image plane is locked to the conventional FoR of the scanner, a region of intense but highly localized signal from the antenna will generally appear at some arbitrary location in the scanner plane or FOV because the location of the endoscope in the laboratory FOR is generally unknown. This region of high sensitivity is simply detected based on signal intensity, then shifted during reconstruction so as to be centered on the most intense signals, derived from the loopless antenna or "MR-eye". The translation is rapid, automatic and does not significantly delay real-time viewing.

After reconstructing the image, the image may be displayed, Step 1210. The image information generated within the computer is displayable by any suitable means 130, such as an LCD or CRT, for example. Alternatively or in addition, the reconstructed image can be stored or rendered in hard copy.

Figure 15:
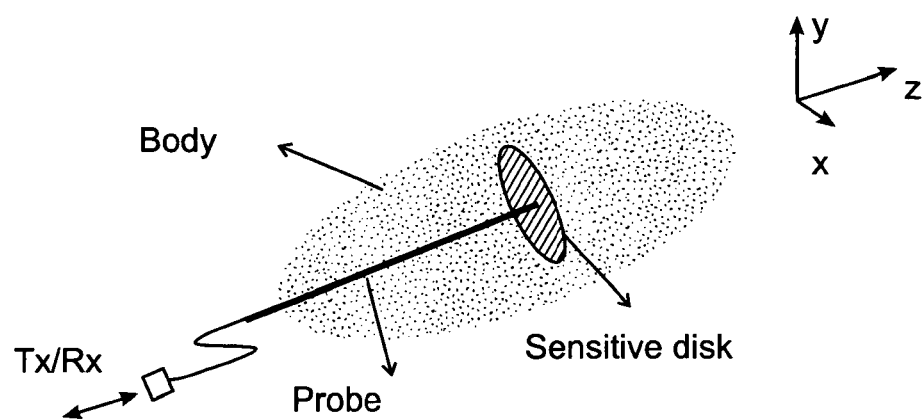
FIG. 15 is an illustrative view of RF Transmission by a probe whose sensitivity is constrained to a disk excites a small volume. Reception of signal using the same probe provides an image arising from this volume.

As described herein, MRI endoscopy according to the present invention intrinsically translates the MRI FoR from that of the scanner, to that of the device or probe itself in at least one dimension. As described further herein, exemplary active small-diameter internal MRI probes were developed whose MRI sensitivity is restricted to a narrow region of the probe by virtue of the local RF magnetic field profile and/or local static or gradient magnetic field mechanisms that are provided on the probe as illustrated in the cartoon of FIG. 15. FIG. 15 shows a "slice"-shaped sensitive region perpendicular to the long axis of a device that can be made the size of a guidewire or intravascular catheter. Because the mechanisms for limiting sensitivity are all confined and intrinsically locked to the body of the probe, it moves with it, transforming the MRI from the laboratory FoR to the FoR of the device itself, creating a true MRI endoscope or "MR-eye". However, because all of the mechanisms involve magnetic field profiling, the thickness of the "slice" localized by these means is not constant but tends to vary with radial distance from the wire as the field lines flatten with distance from the source, and also with probe design. Broadening effects that occur with distance, while a detriment to resolution, can partially offset the radial decline in MRI sensitivity by adding signal contributions from the larger volume. The MRI sensitivity of active internal MRI devices depends on: (i) the MRI coil or antenna design; (ii) the presence of field-profiling elements; and (iii) the transmitter field, each of which can be used alone or in combination with other mechanisms to affect the desired localization to a substantially planar volume perpendicular to the device's long axis for the purposes of MRI endoscopy.

The resulting one-dimensionally (1D) localized volume on the MRI endoscope can be cylindrically-encoded in the other two dimensions of the "sensitive disk" using the phase-shift between the antenna and the scanner's main volume coil for the azimuthal direction, and radially, using the probe's intrinsically radial RF sensitivity gradient as described in U.S. Pat. No. 6,031,375, included by reference herein. However, for purposes of illustration, we presently demonstrate the approach of using conventional MRI gradient localization in the two dimensions of the sensitive disk, and transforming the image to the center of the FOV using a simple maximum signal algorithm.

In accordance with the present invention, the method for performing true MRI endoscopy employs active internal probes operating in modes that permit both real-time MRI from the probe's viewpoint, and high-resolution imaging of surrounding structures such as vessel walls, normal and disease tissues, organs and pathologies. Because the eddy currents induced in the sample are limited to a tiny excited volume as compared to those excited by a conventional body MRI coil, transmitting with the endoscope results in a relatively low local RF power deposition. To maximize the SNR and spatial resolution performance for endoscopic MRI, we have implemented these techniques for the first time for internal MRI, on biological specimens at 3 Tesla with a Philips 3 T Achieva MRI scanner (Philips Medical Systems, Best, NL). We presently provide illustrative examples of the inventive method and devices implemented with RF probes employing both modified tiny loop coils and a modified loopless antenna. The method includes a transmit/receive probe designed for intrinsic slice selection, an associated RF pulse for excitation and a corresponding pulse sequence for imaging as will be explained below.

Example 1

Modified Loopless Antenna

A loopless antenna (previously implemented only at 1.5 T and for detection: see Ocali O, Atalar E. Magn Reson Med 1997; 37:112-118) was fabricated from UT-85C semi-rigid copper coaxial cable by extending its inner conductor extended by 2.3 cm to form a λ/4 whip tuned for 3 T MRI (128 MHz) in a bio-analogous saline solution. The cable and in particular, the whip lengths, depend on the RF electrical properties of the media in which it is placed, as taught by Ocali. A matching circuit was placed at the proximal end of the probe, which had an overall length of 37 cm and 2.75 mm diameter. The match circuitry consisted of a series inductor and a parallel capacitor which were adjusted to present 50Ω to a regular BNC coaxial cable. The probes were connected to the scanner by modifying a standard head-coil transmit/receive interface for single channel use with two cascaded preamplifiers (ARR, Burlington, Conn.) to provide additional gain of up to 80 dB in the receiver chain.

Figure 16:
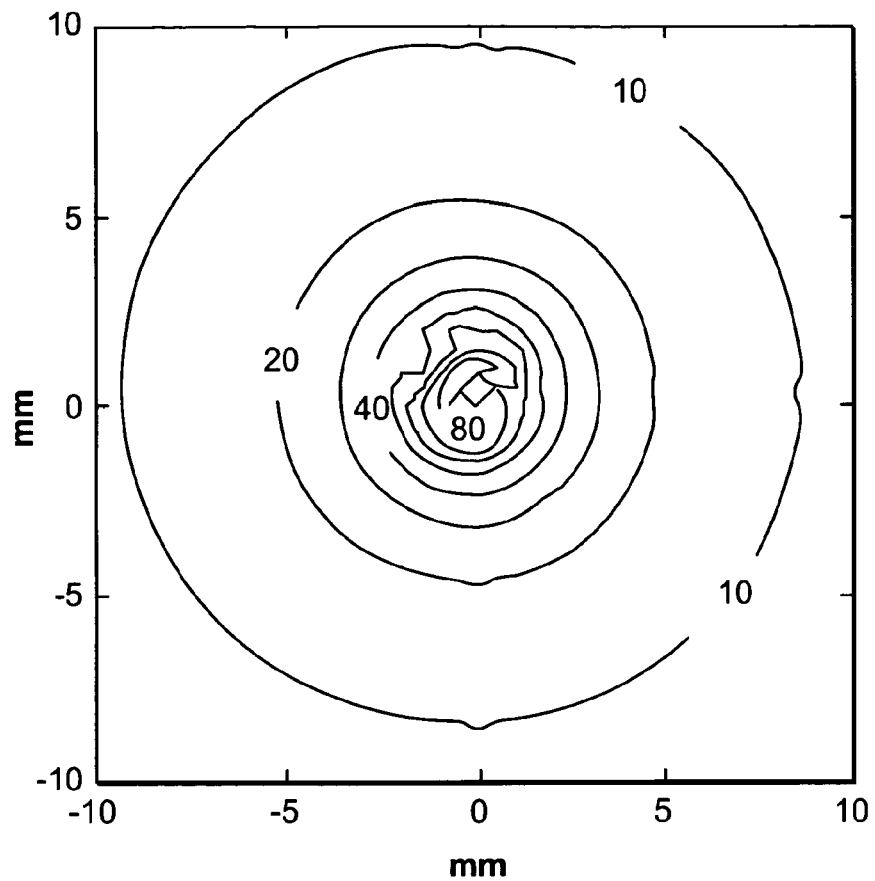
FIG. 16 is a reception profile (contours in arbitrary units) of a loopless antenna probe in a homogeneous medium showing an eight-fold variation within 10 mm.

Used as a detector, the antenna is sensitive along an extended portion of its body as is evident from FIG. 12(b), although the sensitivity is highly nonuniform. The receive sensitivity in an axial slice at the whip-cable junction of the antenna in a homogeneous phantom is shown in FIG. 16. A greater than eight-fold variation of B1 is seen in a 20×20 mm FOV. By the Principle of Reciprocity, if the antenna is used for excitation, the excitation profile will reflect the same variation in B1.

Figures 17A, 17B:
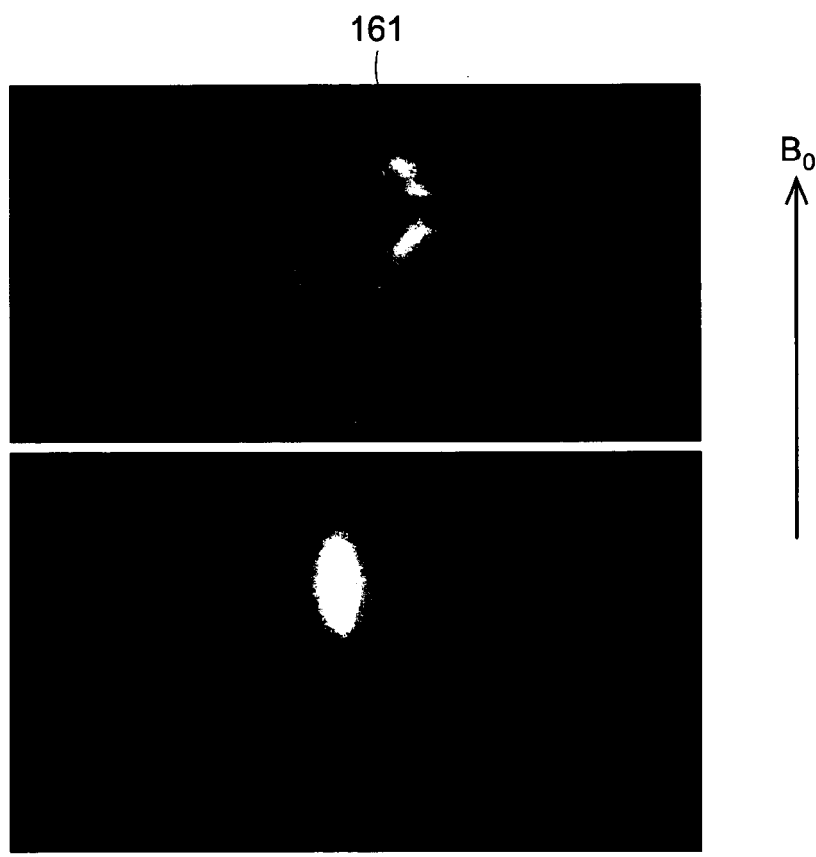
FIGS. 17(a), (b) are illustrative views as shown by MRI illustrating the sensitivity of a bare loopless catheter antenna with a square RF pulse (top) and an adiabatic (BIR-4) RF pulse (bottom).
Figure 18:
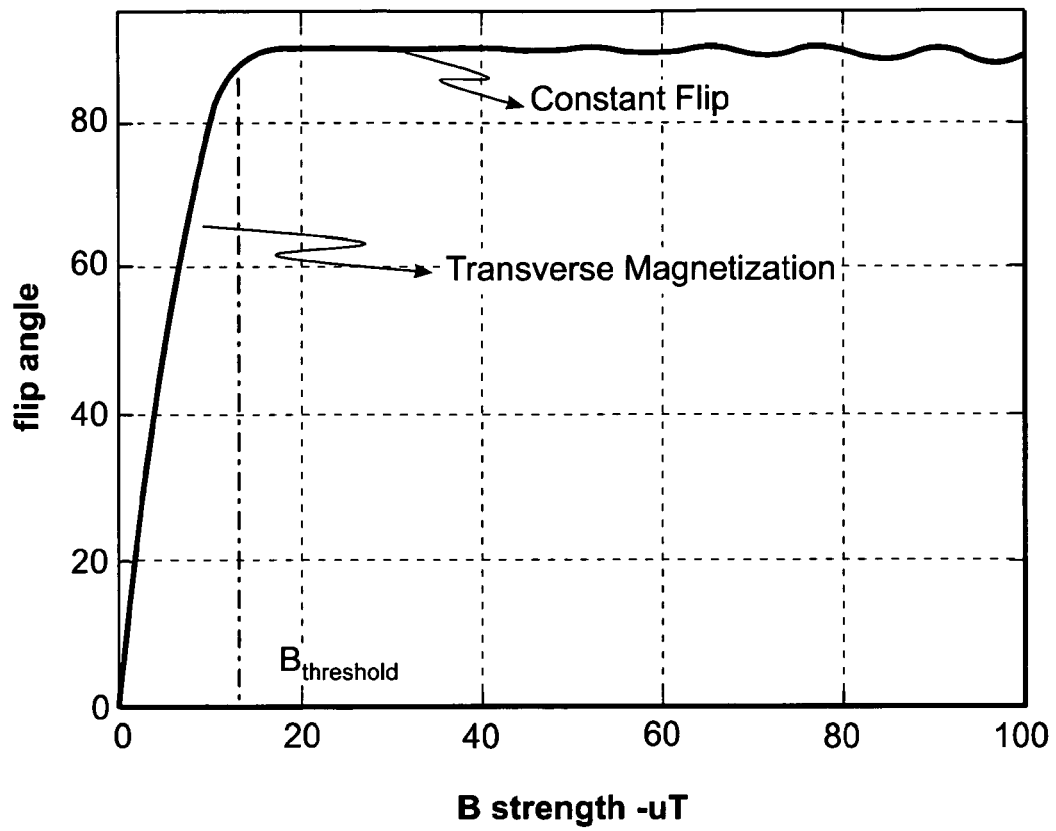
FIG. 18 is a graphical view of flip angle (FA) versus RF magnetic strength (B1) computed for an adiabatic BIR-4 pulse, showing a substantially constant flip-angle above a certain threshold $B_1$.

Thus, when used for both excitation and detection, the 3 T MR images in FIG. 17(a) show for planes parallel to $B_0$ and the antenna's long axis, that the detection sensitivity is modulated by the excitation field resulting in a very non-uniform signal across the sensitive volume of the antenna. The resulting dark regions close to the probe arise where the flip-angles of multiples of 180°, just where the detector sensitivity is greatest. The vertical extent of the images here is ~6 cm. To compensate for this, phase-cycled adiabatic BIR-4 RF pulses [Garwood M, Ke Y. JMR 1991; 94:511-525; Bottomley P A, Ouwerkerk R. JMR 1993; 103, 242-244], were applied to deliver a constant flip-angle above a threshold B1, chosen so as to achieve the desired sensitive disk diameter (perpendicular to $B_0$). The variation in flip-angle vs. B1, as computed numerically from the Bloch equation for a 4 ms adiabatic pulse with a frequency sweep of ±15 kHz is shown in FIG. 18. The excitation pulse delivers a largely constant flip-angle from ~15 µT up to 100 µT. When the probe transmits and receives using this RF pulse, the resulting sensitivity and localization, as shown in FIG. 17(b), are greatly improved close to the probe. In the plane of the sensitive disk orthogonal to $B_0$ at the antenna junction, the same result obtains with adiabatic excitation, as evidenced by MRI in FIG. 19b, compared with the square (regular) pulse excitation shown in FIG. 19a, which does indeed appear as a "sensitive disk". Nevertheless, FIG. 17(b) shows that the sensitive region or width of the sensitive disk in the axial ($B_0$) direction still extends at least 3 cm, affording quite broad resolution.

Figure 20A:
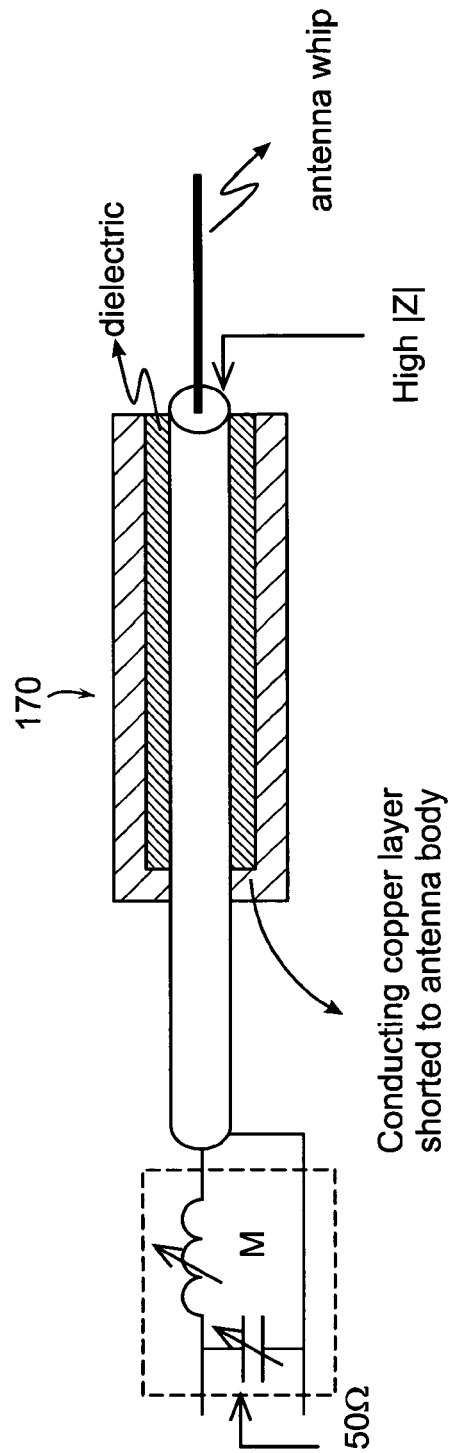
FIG. 20(a) is a schematic view of a loopless antenna according to the present invention illustrating construction of a 'sleeve balun'. The length L is adjusted to obtain a high impedance at the antenna-whip junction. The matching network M is also shown in the figure. The cable length connecting the antenna and balun portion to the match network is not to scale.

To further limit the sensitivity substantially to a region about the whip-antenna junction, the antenna was modified by the addition of a sleeve member, 170, depicted in FIG. 20(a), and as discussed above in the context of FIG. 6. Here, the sleeve member is a conductive sleeve of length λ/4 in the medium of interest, shorted at the proximal end to the antenna body to form a sleeve balun with high impedance at the distal end. Surface waves traveling on the antenna body, which account for its extended sensitivity, are 'choked' by the balun thereby reducing the sensitive length. The balun was formed by adding a dielectric layer of heat-shrink PTFE on the antenna, over which copper tape was attached to form the conductive layer of the sleeve balun. The maximum impedance recorded at the open end was ~400Ω when the conducting sleeve was 35 cm long. Note the matching circuit is also shown in FIG. 20(a), and that the lengths are not drawn to scale. In addition, a switching element (not shown) may be connected across the matching circuitry to deactivate the device during conventional MRI by shorting out tuning elements, to permit switching between endoscopic MRI and conventional MRI in the laboratory FoR.

Figure 20B:
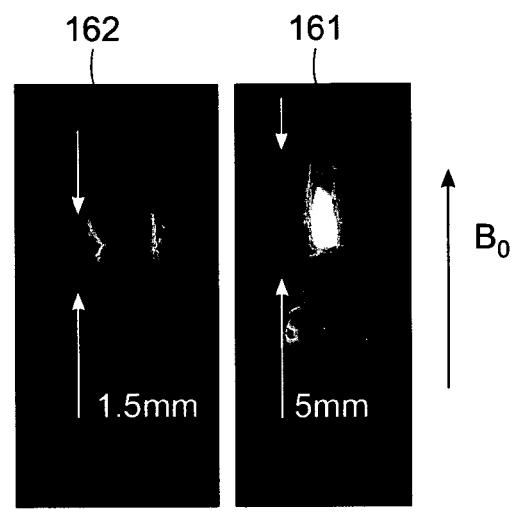
FIG. 20(b) are illustrations of images showing of a full-width-half-maximum (fwhm) excitation slice-widths for a multi-turn loop (left) and a loopless antenna (right) modified in accordance with the present invention.

Transmission of RF by this modified probe using adiabatic pulses now results in a small sensitive region of fwhm ~5 mm in the $B_0$ direction along the endoscope's long axis at the end of the probe, as demonstrated by 3 T MRI of the probe in a gel phantom shown in FIG. 20(b), 161. The fwhm slice width was measured by applying a frequency readout along the probe's axis. Thus, the probe's sensitivity 'sees' a sensitive disk only ~5 mm in extent, obviating the need for slice selection by the scanner: as the probe moves, the imaged slice moves with it and no time is wasted in tracking the probe.

From the stand-point of safety, excitation by the proposed loopless and loop antenna MRI endoscopes requires much lower RF power (e.g., <1 W) that generates much-reduced eddy currents, as compared with conventional body-coil excitation, owing to the very localized sensitivity of the devices. When whole volume excitation is provided by external volume coils, eddy currents induced in the whole sample volume can couple to the probe causing unsafe local heating. The temperature increase can vary considerably depending on tissue properties, conductor geometry and orientation. However, when the probes themselves are used for transmission, the power deposited into the body measured by SAR (SAR—Specific Absorption Rate in W/Kg) is directly proportional to the power required to operate the coils. This power is proportional to the volume and radial extent of images desired, need not be set too high since the reciprocal fall-off in reception sensitivity inherently limits the FOV.

The loopless antenna was found to produce a sufficient FOV (~5×5 cm) for intravascular applications when run at an input power of 0.25 W (r.m.s), as measured at the coil input which agreed with the power reported in the scanner's log file. When compared to ~2.5 kW (r.m.s) for conventional body coil excitation during the pulse, RF transmission by the probe reduces the body average SAR by four orders-of-magnitude. The SAR is given by $\sigma|\vec{E}|^2/2\rho$, where $\vec{E}$ is the electric field generated in a medium of density ρ, conductivity σ, and dielectric constant ∈, by unit current in the antenna. The spatial distribution of SAR was computed using the field equations for the loopless antenna as a simple dipole, with $\rho=100$ Kgm$^{-3}$, $\sigma=0.65$ Sm$^{-1}$, and $\in=80$, and a square adiabatic pulse with a duty cycle of 11. The SAR distribution for a 0.25 W r.m.s input power is shown in FIG. 21(a), and has a maximum local power deposition of ~0.5 WKg$^{-1}$ at the physical tip of the probe. This distribution was averaged over 1 g for the loopless antenna to account for its extended sensitivity profile.

Figure 22:
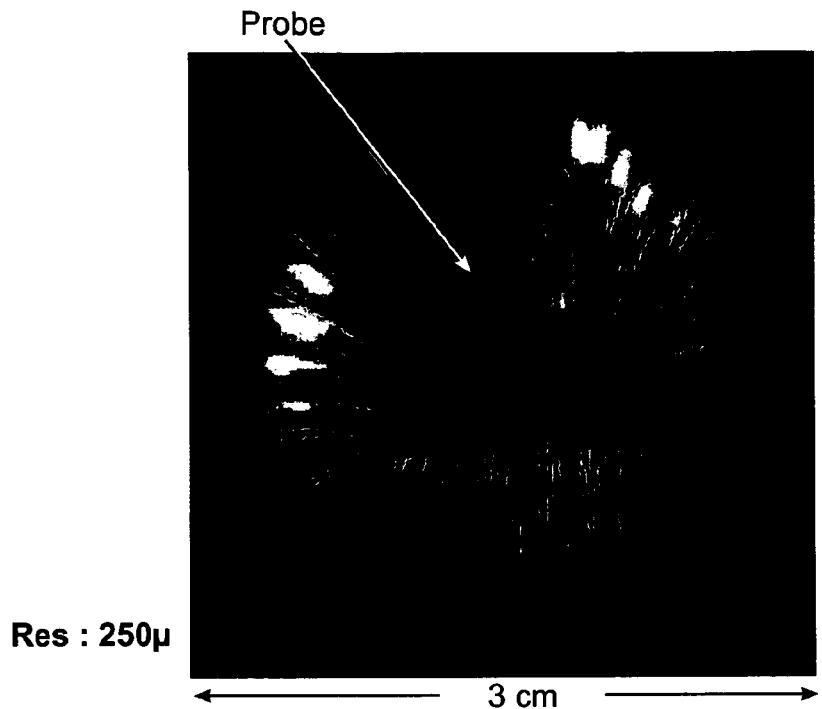
FIG. 22 is a high resolution MRI endoscopic image of a kiwifruit obtained from a loopless antenna probe modified in accordance with the present invention. Slice localization arises entirely from constrained sensitivity of probe (MRI parameters: repetition period, TR=3 s; echo time, TE=12 ms; FOV=50 mm; image array size, Nx=Ny=200. In-plane resolution=250 um).

The loopless antenna-based endoscopic probe and MRI methods were validated in a phantom to determine the localization properties, and then in biologic specimens to evaluate its ability to differentiate heterogeneous tissue structure. An image of a kiwifruit is shown in FIG. 22. The imaging parameters were: TR/TE=3000/12 ms, FA=80°, FOV=50 mm, in-plane resolution=250 µm. No slice selective gradients were applied: the plane is resolution afforded entirely by the mechanisms described above.

Figure 23:
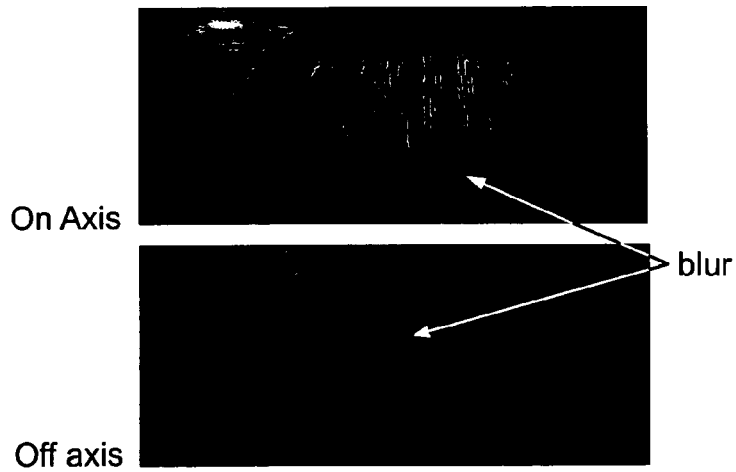
FIG. 23 are illustrations of image effects for on-axis and off-axis arrangements. A portion of the kiwifruit of FIG. 22 showing the blur that results when its axis is not oriented along the slice-select direction, i.e. the scanner bore.

Another aspect of the present invention is its performance off-axis, i.e. when the long axis of the loopless antenna is skewed relative to the $B_0$ direction. Although many vessels are directed predominantly along the z direction (e.g., the aorta), when this is not the case (for example, when the vessel is tortuous) the off-axis structures can bleed into each other resulting in degradation of resolution or blurring, as shown in FIG. 23. The amount of blur depends on factors including the probe design, the morphologic characteristics of the sample, the image resolution and the direction of the probe. To quantify the blur, we used a custom resolution phantom that consists of a 1 mm slit of gel-phantom sandwiched between two thick sheets of acrylic (see FIG. 24, left. The blur was defined as the percentage loss of SNR in the slit as the phantom was rotated off-axis. The blur in this phantom was >25% beyond 20° off-axis resulting in image degradation beyond this angle (see FIG. 24—right). The measured values closely follow the blur values computed from the particular phantom geometry.

In addition, the excitation and detection properties of the probe are also affected at off-axis orientations wherein the B1 field is no longer predominantly perpendicular to $B_0$. As a consequence, adiabatic excitation results in a smaller FOV. This can be compensated for by increasing the input power. During reception, the SNR is also affected by probe orientation.

Example 2

Endoscopy with a Modified Loop Coil

Figure 25:
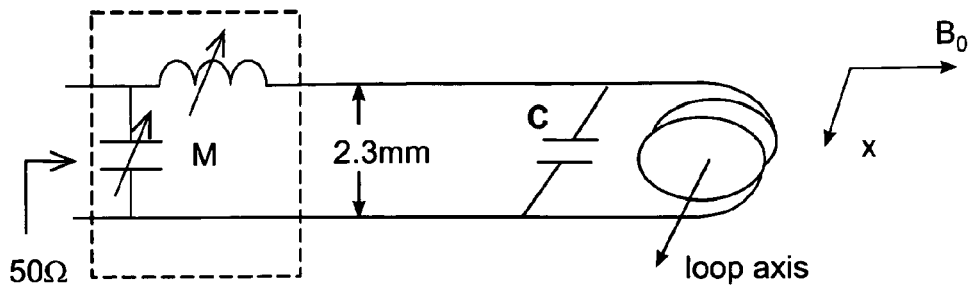
FIG. 25 is a schematic view depicting a multiturn loop coil of the present invention and the corresponding match network M. The distance between the loop and the matching circuit is not to scale and the matching circuit can be next to the loop, or preferably at a distance placing it outside the body. The leads connecting the coil and match network may preferably be in the form of a coaxial cable. The loop axis is substantially perpendicular to $B_0$.

A loop antenna MRI endoscopy probe of geometry illustrated in FIG. 25 was fabricated of 0.3 mm diameter insulated copper wire, and resonated to 128 MHz for 3 T use with a 51 pF capacitor (ATC non-magnetic, 1.7 mm size). The axis of the loops was maintained perpendicular to $B_0$ and the long axis of the probe, to maximize the sensitive region when the antenna lead is oriented parallel to $B_0$. The unloaded Q of the coil was measured at 85 which fell to 35 when loaded with 0.35% saline solution. A 23 cm UT-85C semi-rigid copper coaxial (dia. 2.3 mm) was soldered to the coil to connect with the matching circuit at the end of this cable (at left). A switching element (not shown) may be connected across the matching circuitry to deactivate the coil during conventional MRI, to permit switching between endoscopic MRI and conventional MRI as noted above. The length of the coaxial cable was empirically chosen for experimental convenience. The coil along with the semi-rigid coax was insulated using PTFE heat-shrink tube to present a smooth profile for ease of internal use (FIG. 2??).

Figure 26:
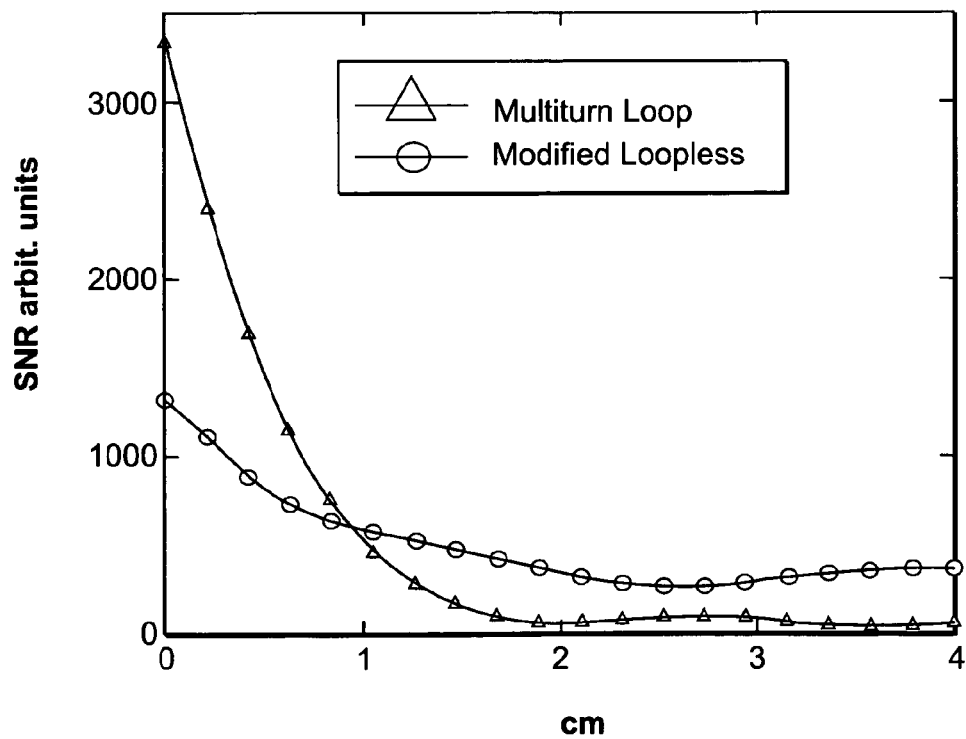
FIG. 26 is a graphical view of experimental SNR versus radial distance from the probe, in cm for exemplary loopless (circles), and loop (triangles) endoscopic probes.

This coil geometry has an inherently more discrete sensitivity profile along the probe axis compared to the loopless antenna. It is basically limited to the extent of the coil in the $B_0$ direction, which in this case leads to a fwhm of 1.5 mm, as measured by MRI with the probe in a gel phantom shown in FIG. 20b, 162, affording better resolution than the loopless antenna. The experimental SNR as a function of radial distance in the sensitive plane for the loop probe as compared with the loopless probe is presented in FIG. 26. This suggests that the loop design is well endowed with high SNR for MRI of small regions of interest (<1 cm) while the loopless antenna offers a larger FOV. This is supported by an endoscopy study with the loop antenna inserted into an intact porcine aorta shown in FIG. 27. The MRI parameters were: TR/TE=500/20 ms, FA=20°, FOV=15 mm, and an in-plane resolution of 100 µm. No external slice localization has been applied-slice localization arises entirely from the probe localization mechanisms presented herein.

Figure 21B:
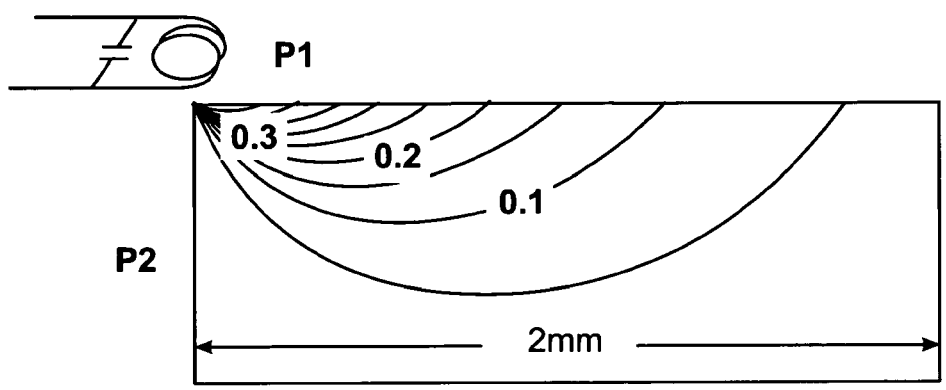
FIG. 21 are illustrative contour plots of the spatial distribution of the specific absorption rate (SAR) computed for a loop (above; b) and a loopless antenna (below; a). Values (in W/Kg) have been normalized to ¼ W input power. P1 and P2 show the location of sensors to measure the temperature increase on experimental prototypes.
Figure 21A:
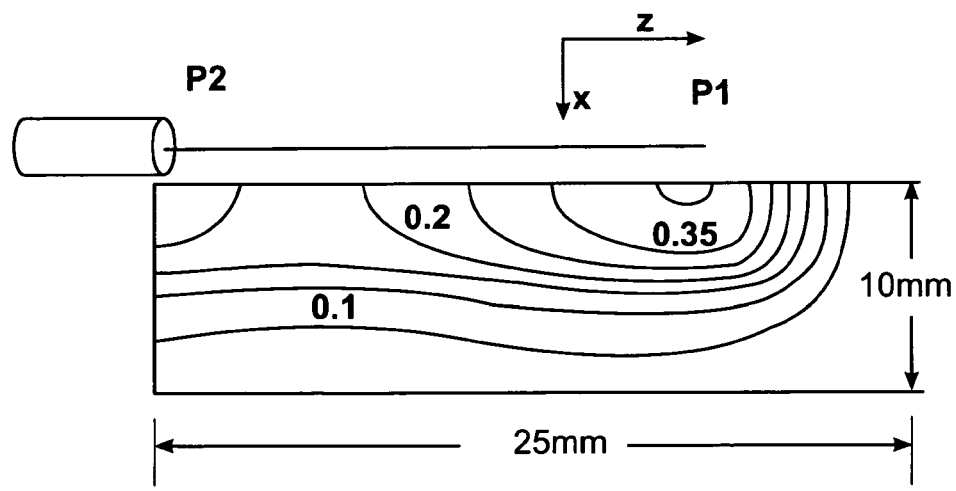

Regarding device safety, the computed SAR distribution of the loop probe averaged over 1 g is included as FIG. 21(b) employing the same adiabatic excitation used for FIG. 21(a). Again, the maximum local power deposition is ≤0.5 WKg$^{-1}$, which occurs at the center of the coil. In fact, both the modified loop and loopless MRI endoscopic probes were heat tested experimentally, as well. The probes were immersed in an agarose gel phantom that mimicked tissue characteristics (3 g/L agarose in 0.35% saline solution), and a MRI pulse sequence was adjusted to provide maximum SAR (4 ms pulses, TR=44 ms, duty cycle=11, FA=90°) over a ten-minute scan period in the Philips 3 T scanner. The temperature rise in the gel was measured using fiber optic temperature sensors (Neoptix, Québec City, Canada) which were placed at the tip of the probe, at locations around the probe (see FIG. 21: P1,P2) and at the probe-phantom junction (not shown). There was no temperature rise when the endoscope was operated at the normal input of 0.25 W (r.m.s). A measurable temperature increase of 0.7° C. was seen in only in sensor P1 when the input power was increased tenfold to 2.5 W. The local SAR, as calculated from the experimental temperature rise ΔT in time Δt, using $$\frac{\Delta T}{\Delta t} \times c$$

where c=specific-heat-capacity (4160 JKg$^{-1}$K$^{-1}$) at this increased power was 4.8 WKg$^{-1}$. This indicates that peak SAR during regular endoscope operation was ~0.5 WKg$^{-1}$ in agreement with the calculations. The total time averaged power deposited in the body by the loop probe is given by $$W_t \left[1 - \frac{Q_l}{Q_u}\right] * d$$

where $W_t$ is 0.25 W, $Q_l$, $Q_u$ are the loaded and unloaded Q, duty cycle d=11 is 0.01 W which is well within safety limits.

As was the case with the modified loopless antenna endoscope, the loop coil probe's excitation and detection properties are affected by off-axis orientations relative to $B_0$. The average SNR drop while the probe moves off-axis in a homogenous phantom was measured relative to the maximum SNR in FIG. 28. There is up to 20% drop in SNR when the probe is 30° off axis which however did not cause perceivable image degradation when imaging heterogeneous structures. The measured values agree with computations made from near field analysis of the loop antenna. Care was taken to differentiate the SNR drop due to 'blur' from this analysis.

Thus the MR endoscope of the present invention is demonstrated using probe designs based on modified loops and the loopless antenna. The multi-turn loop MR endoscope performed better in terms of constraining slice-width as well as SNR close to the coil. On the other hand its miniaturization for tiny vessels is limited by the finite diameter of the coils, and by the size of tuning elements if these are needed, as compared to loopless devices that can be fabricated essentially as small as the thickness of a wire cable if need be. The loopless antenna endoscope's geometry may therefore be advantageous for the smallest diameter cavities and blood vessels. Restricting the sensitivity along its axis is more difficult for the loopless design: the sleeve balun design is effective but requires care in adjusting for different loaded lengths of the antenna in the sample. We have performed experiments with paramagnetic and/or lightly ferromagnetic coatings to dephase the signal coming from the extended length, which may also be applied to other types of internal coils, such as opposed solenoids, expandable coils and elongated loops to limit sensitivity to a desired region.

The probes are designed to be intrinsically sensitive to a nominally defined 'slice'. The actual shape of the sensitive region may resemble a hyperboloid or an ellipsoid depending on the particular probe, and may be irregular. Nevertheless, the excellent agreement between endoscopic MRI and images obtained with conventional slice-selective MRI demonstrates that these affects may have little practical negative impact.

While probe sensitivity localized the signal in one dimension, regular 2D encoding was demonstrated here for the other two. This can cause some 'blur' when imaging vessels that are off-axis with the slice-encode direction. To eliminate the blur, the orientation of the image slice may be altered by joy-stick or track-ball control of the scanner's gradient encoding directions. The orientation feedback need only be applied intermittently when the probe has changed its orientation significantly. As an alternative, all three dimensions may be moved to the probe head using strategies such as cylindrical encoding per U.S. Pat. No. 6,031,375.

The endoscopy methods produced negligible heating effects in a phantom both as calculated, and in experiments suggesting the safety of the method.

Although preferred embodiments of the invention have been described using specific terms, such description is for illustrative purposes only, and it is to be understood that changes and variations may be made without departing from the spirit or scope of the following claims.

INCORPORATION BY REFERENCE

All patents, published patent applications and other references disclosed herein are hereby expressly incorporated by reference in their entireties by reference.

EQUIVALENTS

Those skilled in the art will recognize, or be able to ascertain using no more than routine experimentation, many equivalents of the specific embodiments of the invention described herein. Such equivalents are intended to be encompassed by the following claims.

What is claimed is:

1. A method of magnetic resonance imaging (MRI) of a specimen, comprising the steps of:
   providing a MRI device having a first coordinate frame of reference within a second coordinate frame of reference and a localized region of MRI sensitivity in at least one spatial dimension, wherein the MRI device is selected from the group consisting of an antenna, an endoscope, a probe, a needle, a catheter, a guidewire, and a therapy delivery device;
   introducing the MRI device into the specimen;
   locking in at least one spatial dimension to the first coordinate frame-of-reference of the MRI device;
   acquiring MRI image data while the second coordinate frame of reference for imaging is intrinsically locked to the localized sensitive region of the introduced MRI sensitive device;
   wherein the second coordinate frame of reference is intrinsically locked to the localized sensitive region of the MRI device by at least one of:
   (a) providing a spoiling magnetic field effect along a length of the MRI device except from an area where the MRI signal is desired, and
   (b) providing the MRI device with sensitivity confined to a predetermined shaped volume of the specimen about an area of the antenna coupled to the MRI device by selectively transmitting RF signal pulses from the MRI device and selectively receiving MRI signals from the shaped volume;
   wherein the acquiring image data includes selectively transmitting RF signal pulses from the MRI device and selectively receiving MRI signals from the localized sensitive region and providing an MR pulse sequence to perform 2D spatial encoding relative to the MRI device; and
   processing the MRI signals to provide MRI signal data from the coordinate frame of reference of the MRI device.

2. The method of claim 1, wherein the antenna is a loopless antenna that is introduced into the specimen.

3. The method of claim 2, further comprising configuring the loopless antenna such that the loopless antenna is provided with the localized sensitive region of the MRI device, wherein said configuring includes at least one of:
   (a) coating along a length of the loopless antenna except the area where the MRI signal is desired with a material having desired magnetic properties;
   (b) embedding at least one permanent magnet along a length of the loopless antenna except the area where the MRI signal is desired;
   (c) coiling wire along a length of the loopless antenna except the area where the MRI signal is desired, the wire being arranged to create a spoiling gradient magnetic field;
   (d) coiling wire along a length of the loopless antenna, the wire being arranged to create a linear magnetic field gradient over at least the area where the MRI signal is desired; and
   (e) providing a sleeve portion along a length of the loopless antenna that incorporates electrically conducting material to spoil the RF magnetic field except in the area where the MRI signal is desired, wherein said electrically conducting material is separated from the loopless antenna by a dielectric material.

4. The method of claim 3, wherein the material having desired magnetic properties is one of a strongly paramagnetic material or a ferromagnetic material.

5. The method of claim 3, further comprising the step of providing an insulating dielectric layer covering said loopless antenna.

6. The method of claim 1, wherein the antenna includes one or more loops that is introduced into the specimen.

7. The method of claim 6, wherein the MRI device has a long axis and wherein the one or more loops are arranged so an axis of the one or more loops is one of orthogonal to the device long axis or parallel to the device long axis.

8. The method of claim 1, wherein said providing the MRI device includes providing an MRI scanner including an external excite coil and an MRI device, the MRI scanner and MRI device being arranged and configured so the frame of reference is inherently locked to the MRI device and so the selectively received MRI signal from the localized sensitive region is confined to the predetermined shaped volume of the specimen about the MRI device; and
   wherein said acquiring MRI image data further includes dephasing magnetization of the MRI device over a region of a MRI-sensitive length of the MRI device except for another region having a length for which signal selection is required, whereby the length of the another region establishes a third dimension of the shaped volume.

9. The method of claim 8, wherein said providing an MR pulse sequence and performing 2D spatial encoding in the radial and azimuthal directions relative to the probe includes phase encoding and applying read-out gradients by the MRI scanner in the frame of reference of the MRI scanner.

10. The method of claim 9, wherein said processing of MRI signals further comprises the step of:
    reconstructing an image from said predetermined shaped volume which is localized to the frame of reference of said MRI probe.

11. The method of claim 1, wherein said MRI of a specimen is in three dimensions, and wherein said providing the MRI device includes
    providing an MRI scanner including an external excite coil and an MRI device, the MRI scanner and device being arranged and configured so the frame of reference is inherently locked to the MRI device and so the selectively received MRI signal from the localized sensitive region is confined to an extended volume of the specimen coaxial with the MRI device;

and wherein said using the MRI device and processing the MR signals further includes spatial-encoding in the form of a read-out gradient being provided in the third dimension by changing a local magnetic field.

12. The method of claim 8, wherein said predetermined shaped volume is an extended volume of the specimen coaxial with the MRI probe;

said providing an MR pulse sequence is carried out so as to thereby 2D spatial encode the extended volume relative to the probe; and wherein the MRI probe being provided includes opposed solenoid coil windings on the body of the probe.

13. The method of claim 1, wherein said providing the MRI device includes providing an MRI scanner including an external excite coil and an MRI device, the MRI device being arranged and configured so as to provide a non-uniform sensitivity profile and the MRI scanner and device being arranged and configured so the frame of reference is quasi-locked to the MRI device and so the selectively received MRI signal from the localized sensitive region is confined to a disk-shaped volume of the specimen;

wherein said selectively transmitting RF signal pulses includes providing slice-shaped selection in a third dimension with use of at least one adiabatic excitation from the MRI device, and said selectively receiving MRI signals from a portion of the volume includes providing a non-uniform sensitivity profile of the device;

2D spatially encoding by phase encoding the volume to be imaged; and applying read-out gradients by the MRI scanner in a frame of reference of the MRI scanner.

14. The method of claim 13, wherein said providing an MRI device having the non-uniform sensitivity profile comprises at least one of:

(1) coating the device over a region of its MRI-sensitive length except for a portion from which signal selection is desired, and wherein said coating dephases the magnetization from adjacent regions;

(2) providing at least one small permanent magnet on the MRI device, located in regions on the probe where the signal is to be eliminated thereby dephasing the magnetization by changing the local magnetic field;

(3) providing a spoiling gradient winding on the MRI device over a region of its MRI-sensitive length except for a length at the region for which signal selection is required, and exciting said gradient winding during MR transmission, thereby dephasing the magnetization by changing the local magnetic field;

(4) providing opposed solenoid coil windings on the body of the MRI device and exciting the gradient with DC during RF transmission to provide a linear magnetic field gradient and performing slice localization using the gradient; or (5) providing a sleeve portion that incorporates electrically conducting material to spoil the RF magnetic field except in the area where signal is desired, wherein said electrically conducting material is separated from the MRI device by a dielectric material.

15. The method of claim 1, wherein said selectively transmitting RF signal pulses from the MRI device from the localized region of MRI sensitivity includes excitation by at least one adiabatic pulse.

16. The method of claim 1, wherein said processing the MRI signals further comprises reconstruction of said MRI signal data and using said reconstructed MRI signal data to display images at a center of the frame of reference of the MRI device.

17. The method of claim 1, wherein said processing the MRI signals further comprises reconstruction of said MRI signal data and displaying said reconstructed MRI signal data as images in real time.

18. The method of claim 8, wherein said dephasing magnetization of the MRI probe includes dephasing the magnetization by coating the MRI device with a material over a region of its MRI-sensitive length except for the length of the another region for which signal selection is required.

19. The method of claim 8, wherein said dephasing magnetization of the MRI probe includes providing a spoiling gradient winding on the MRI probe over a region of its MRI-sensitive length except for the length of the another region for which signal selection is required, and exciting said gradient winding during MR transmission.

20. The method of claim 11, wherein said spatial-encoding in the form of a read-out gradient being provided in the third dimension includes providing a variable-pitch gradient winding on the MRI probe over a region of its MRI-sensitive length, and exciting said gradient winding during MR reception so that a Fourier Transformation (FT) of each received signal is proportional to a projection of the MRI signal distribution along the axis of the wire.

21. The method of claim 12, further comprising the step of:

exciting said opposed solenoid coil windings with direct current during RF transmission so as to provide a linear magnetic field gradient, thereby providing a disk-shaped slice-selection in the third dimension.

22. An MRI system for providing images of a specimen comprising:

an external MR system with a scanner coordinate frame of reference further comprising a magnetic field generator a gradient magnetic field generator, an MR excitation field, an antenna, and an MR image processor;

an MRI device having localized sensitivity within the specimen and being arranged and configured with an endoscopic device coordinate frame of reference locked to the localized sensitive region of the introduced MRI sensitive device by at least one of (a) a spoiling magnetic field effect along a length of the MRI device except from an area where signal is desired, and (b) the MRI device configured to selectively transmit RF signal pulses from the MRI device and selectively receive MRI signals from a shaped volume to thereby confine sensitivity to a predetermined shaped volume of the specimen about an area of an antenna couple to the MRI device;

a transmitter for transmitting an MRI signal to the MRI device;

a controller having software for applying successive magnetic field gradients and acquiring data by selectively transmitting RF signal pulses from the MRI device and selectively receiving MRI signals from the localized sensitive region and providing an MR pulse sequence to perform spatial encoding said predetermined shaped volume to be imaged in the radial and azimuthal directions relative to the MRI device; and a display device configured to receive the one or more signals from the controller and display images from the predetermined shaped volume.

23. The external MR system of claim 22, wherein gradient magnetic field generator includes providing low frequency currents to produce a spoiling or gradient magnetic field to the MR probe to localize sensitivity to a local volume to be imaged.

24. The external MR system of claim 22, wherein providing an MR excitation field includes providing adiabatic excitation pulses.

* * * * *